US012713788B2

(12) United States Patent
Son et al.

(10) Patent No.: US 12,713,788 B2

(45) Date of Patent: Aug. 18, 2026

(54) DISPLAY DEVICE AND METHOD OF TESTING THE SAME

(71) Applicant: Samsung Display Co., Ltd., Yongin-Si (KR)

(72) Inventors: Sung Min Son, Cheonan-si (KR); Jae Jin Song, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 544 days.

(21) Appl. No.: 17/967,955

(22) Filed: Oct. 18, 2022

(65) Prior Publication Data

US 2023/0320147 A1 Oct. 5, 2023

(30) Foreign Application Priority Data

Mar. 30, 2022 (KR) ........................ 10-2022-0039487

(51) Int. Cl.

*H10K 59/131* (2023.01)
*G09G 3/00* (2006.01)
*G09G 3/3291* (2016.01)
*H10K 59/35* (2023.01)

(52) U.S. Cl.

CPC ........... *H10K 59/131* (2023.02); *G09G 3/006* (2013.01); *G09G 3/3291* (2013.01); *H10K 59/353* (2023.02)

(58) Field of Classification Search

CPC .. H10K 59/131; H10K 59/353; H10K 59/352; H10K 59/35; H10K 71/70; G09G 3/006; G09G 3/3291; G09G 3/3233; G09G 3/3225; G09G 2300/0426; G09G 2330/12; G01R 31/2825; G01R 31/2839; G01R 31/2843; G01R 31/52; G01R 31/66

See application file for complete search history.

(56) References Cited

U.S. PATENT DOCUMENTS

| | | | |
|---|---|---|---|
| 11,276,339 B2 | 3/2022 | Kim et al. | |
| 11,302,769 B2 | 4/2022 | Kim et al. | |
| 2018/0350284 A1* | 12/2018 | Park | G09G 3/006 |
| 2019/0181191 A1* | 6/2019 | Chen | H10K 59/121 |

FOREIGN PATENT DOCUMENTS

| | | |
|---|---|---|
| KR | 10-2016-0095313 A | 8/2016 |
| KR | 10-2018-0132200 A | 12/2018 |
| KR | 10-2019-0069180 A | 6/2019 |
| KR | 10-2096622 B1 | 4/2020 |
| KR | 10-2020-0120781 A | 10/2020 |
| KR | 10-2021-0105458 A | 8/2021 |

* cited by examiner

*Primary Examiner* — Brigitte A Paterson

(74) *Attorney, Agent, or Firm* — Innovation Counsel LLP

(57) ABSTRACT

Disclosed herein are a display device, and a method of testing a display device. The display device includes sub-pixels arranged along pixel columns, wire pads disposed in a non-display area and disposed on one side of the display area, fan-out lines extending in a first direction and connecting the sub-pixels with the wire pads, data lines extending in the first direction and connected to the fan-out lines, connection wires connecting the fan-out lines with the data lines, at least one of the connection wires including a first portion passing through the display area and extending in a second direction crossing the first direction; and a test unit disposed between the wire pads and the display area and electrically connected to the fan-out lines. The test unit applies a test voltage to the fan-out lines to check a short-circuit or an open-circuit in the fan-out lines.

19 Claims, 17 Drawing Sheets

SL: Sk, Sk-1, Sk+1

DISPLAY DEVICE AND METHOD OF TESTING THE SAME

This application claims priority to Korean Patent Application No. 10-2022-0039487 filed on Mar. 30, 2022, in the Korean Intellectual Property Office, and all the benefits accruing therefrom under 35 U.S.C. 119, the contents of which in its entirety are herein incorporated by reference.

BACKGROUND

1. Field of the Disclosure

The disclosure relates to a display device and a method of testing the same.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions. Display devices may be flat panel display devices such as a liquid-crystal display device, a field emission display device, and a light-emitting display device. Among such flat panel display devices, a light-emitting display device includes a light-emitting element so that each of the pixels of the display panel can emit light by themselves. Accordingly, a light-emitting display device can display images without a backlight unit that supplies light to the display panel.

Recently, a display device having a thin bezel is preferred. If the non-active area is too small for a thin bezel, there may not be an enough area through which fanned-out wires can pass.

A light-emitting display device may include a plurality of pixels. Each of the plurality of pixels may include a light-emitting element, a driving transistor for controlling the amount of driving current supplied to the light-emitting element according to a voltage applied to the gate electrode of a driving transistor, and a scan transistor for supplying a data voltage from a data line to the gate electrode of the driving transistor in response to a scan signal from a scan line. Such a display device requires a lighting test and a spider line test that transmits the outputs from the driving IC.

SUMMARY

Aspects of the disclosure provide, lighting test and spider line test can be conducted more clearly even with a thin bezel structure of a display device that still provides the path of the fan-out lines.

It should be noted that objects of the disclosure are not limited to the above-mentioned object; and other objects of the disclosure will be apparent to those skilled in the art from the following descriptions.

According to an embodiment of the disclosure, a display device comprises a plurality of pixels arranged in a matrix configuration along a plurality of pixel columns and a plurality of pixel rows, each of the plurality of pixels including a plurality of sub-pixels disposed in a display area, a plurality of data lines extending in the first direction to traverse the display area and connected to the plurality of sub-pixels, respectively, a plurality of wire pads disposed in a non-display area that is a peripheral area of the display area and disposed on one side of the display area, a plurality of fan-out lines extending in a first direction and connected to the plurality of wire pads, respectively, a plurality of connection wires connecting the plurality of fan-out lines with the plurality of data lines, respectively, at least one the plurality of connection wires comprising a first portion disposed in the display area and extending in a second direction crossing the first direction, and a test unit disposed between the plurality of wire pads and the display area, and electrically connected to the plurality of fan-out lines, wherein the test unit is configured to apply a test voltage to the plurality of fan-out lines to check a short-circuit or an open-circuit in the plurality of fan-out lines.

The plurality of sub-pixels may comprise red sub-pixels, green sub-pixels, and blue sub-pixels, the red sub-pixels and the blue sub-pixels may be disposed adjacent to one another in the first direction, wherein the green sub-pixels may be arranged in the first direction, and the red sub-pixels and the green sub-pixels may be disposed adjacent to one another in the second direction.

The plurality of fan-out lines may be alternately connected to one of the plurality of connection wires or one of the plurality of data lines.

The test unit may comprise, a plurality of switches, each of the plurality of switches including a gate terminal, a first terminal and a second terminal, a test voltage line for supplying a test control signal to the gate terminal of each of the plurality of switches, a first control line for supplying a first test data signal to first terminals of the plurality of switches connected to data lines which supply data signals to pixels disposed in an odd numbered pixel columns, and a second control line for supplying a second test data signal to first terminals of the plurality of switches connected to data lines which supply data signals to pixels disposed in an even numbered pixel columns.

The first test data signal may be a black data voltage, and the second test data signal may be a white data voltage.

The second terminals of the plurality of switches may be connected to the plurality of data lines via the plurality of fan-out lines.

The plurality of switches may be implemented as transistors, the gate terminal is a gate electrode, the first terminal is a drain electrode, and the second terminal is a source electrode.

The fan-out lines disposed adjacent to each other in the second direction are disposed on different layers.

The display device may further comprise a lighting circuit disposed in the non-display area and disposed between the display area and the test unit, wherein the lighting circuit may be located adjacent to the display area.

The plurality of data lines may be connected to the plurality of fan-out lines through the lighting circuit.

Each of the plurality of connection wires may further comprise a second portion extending extended in the first direction.

The second portion may be disposed on a same layer as the plurality of data lines.

According to another embodiment of the disclosure, a display device comprises a plurality pixels arranged in a matrix configuration along a plurality of pixel columns and a plurality of pixel rows, each of the plurality pixels including a plurality of sub-pixels disposed in a display area, a plurality of wire pads disposed in a non-display area that is a peripheral area of the display area and disposed on one side of the display area, a plurality of fan-out lines connecting the plurality of sub-pixels with the plurality of wire pads, and a test unit disposed between the plurality of wire pads and the display area and electrically connected to the plurality of fan-out lines, wherein the test unit comprises, a plurality of switches, each of the plurality of switches including a gate terminal, a first terminal and a second terminal, a test voltage line for supplying a test control signal to the gate terminal of each of the plurality of switches, a first control line for supplying a first test data signal to a first terminal of one of the plurality of switches connected to a data line which supplies a data signal to a sub-pixel disposed in an odd numbered pixel column, and a second control line for supplying a second test data signal to a first terminal of one of the plurality switches connected to a data line which supplies a data signal to a sub-pixel disposed in an even numbered pixel column.

The second terminals of the plurality of switches may be connected to a plurality of data lines, respectively.

The second terminals of the plurality of switches may be connected to the plurality of data lines via the plurality of fan-out lines, respectively.

The plurality of switches may be implemented as transistors, and the gate terminal may be a gate electrode, the first terminal may be a drain electrode, and the second terminal is a source electrode.

Fan-out lines disposed adjacent to each other are disposed on different layers.

The first test data signal may be a black data voltage and the second test data signal is a white data voltage.

According to yet another aspect of the present disclosure, a method of testing a display device comprises preparing a display device, the display device may include a plurality of pixels arranged in a matrix configuration along a plurality of pixel columns and a plurality of pixel rows, each of the plurality of pixels including sub-pixels disposed in a display area, a plurality of data lines extending in the first direction to traverse the display area and connected to the plurality of the subpixels, respectively, a plurality of wire pads disposed in a non-display area that is a peripheral area of the display area and disposed on one side of the display area, a plurality of fan-out lines extending in a first direction and connected to the plurality of wire pads, respectively, a plurality of connection wires connecting the plurality of fan-out lines with the plurality of data lines, respectively, at least one of the plurality of connection wires comprising a first portion disposed in the display area and extending in a second direction crossing the first direction, a display driver circuit disposed in the non-display area on a lower side of the display area and connected to the sub-pixels via the plurality of fan-out lines, and a test unit disposed between the display area and the display driver circuit and disposed adjacent to the display driver circuit, the test unit comprising a plurality of switches, each of the plurality of switches being connected between a control line which supplies a data control signal and a fan-out line, and including a gate terminal connected to a test voltage line, and applying a test control signal to the test voltage line to check an open-circuit or a short-circuit in the plurality of fan-out lines.

The display device may further including a lighting circuit disposed in the non-display area between the display area and the test unit, and the method further comprising checking lighting of the sub-pixels by the lighting circuit.

According to an embodiment of the disclosure, lighting test and spider line test can be conducted more clearly even with a thin bezel structure that still provides the path of the fan-out lines.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

The present inventive concept will now be described more fully hereinafter with reference to the accompanying drawings, in which preferred embodiments of the inventive concept are shown. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present inventive concept. Similarly, the second element could also be termed the first element.

Hereinafter, embodiments of the disclosure will be described with reference to the accompanying drawings.

Figure 1:
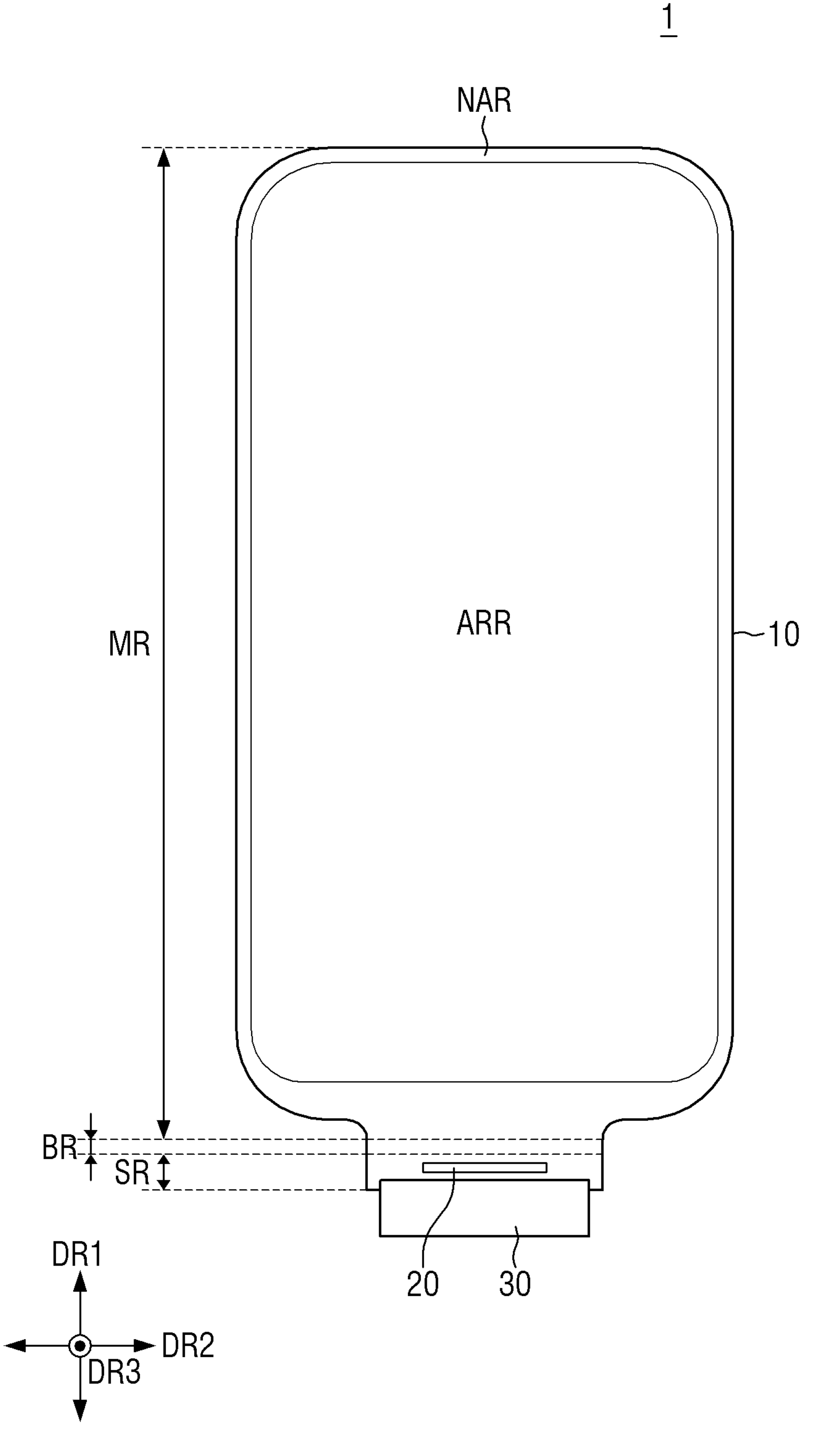
FIG. 1 is a plan view showing a display device according to an embodiment of the disclosure.
Figure 2:
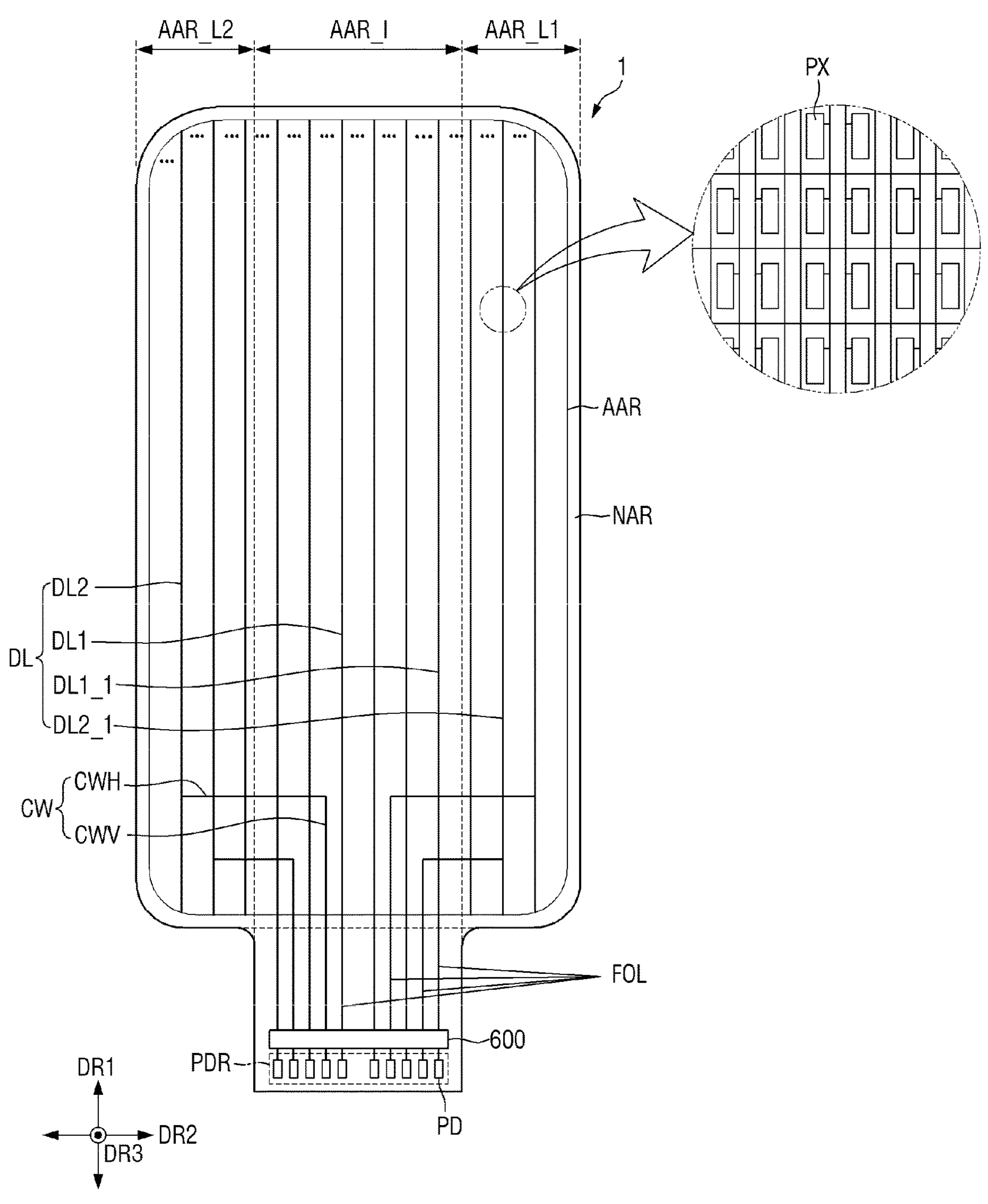
FIG. 2 is a plan view showing a display device according to an embodiment of the disclosure.
Figure 3:
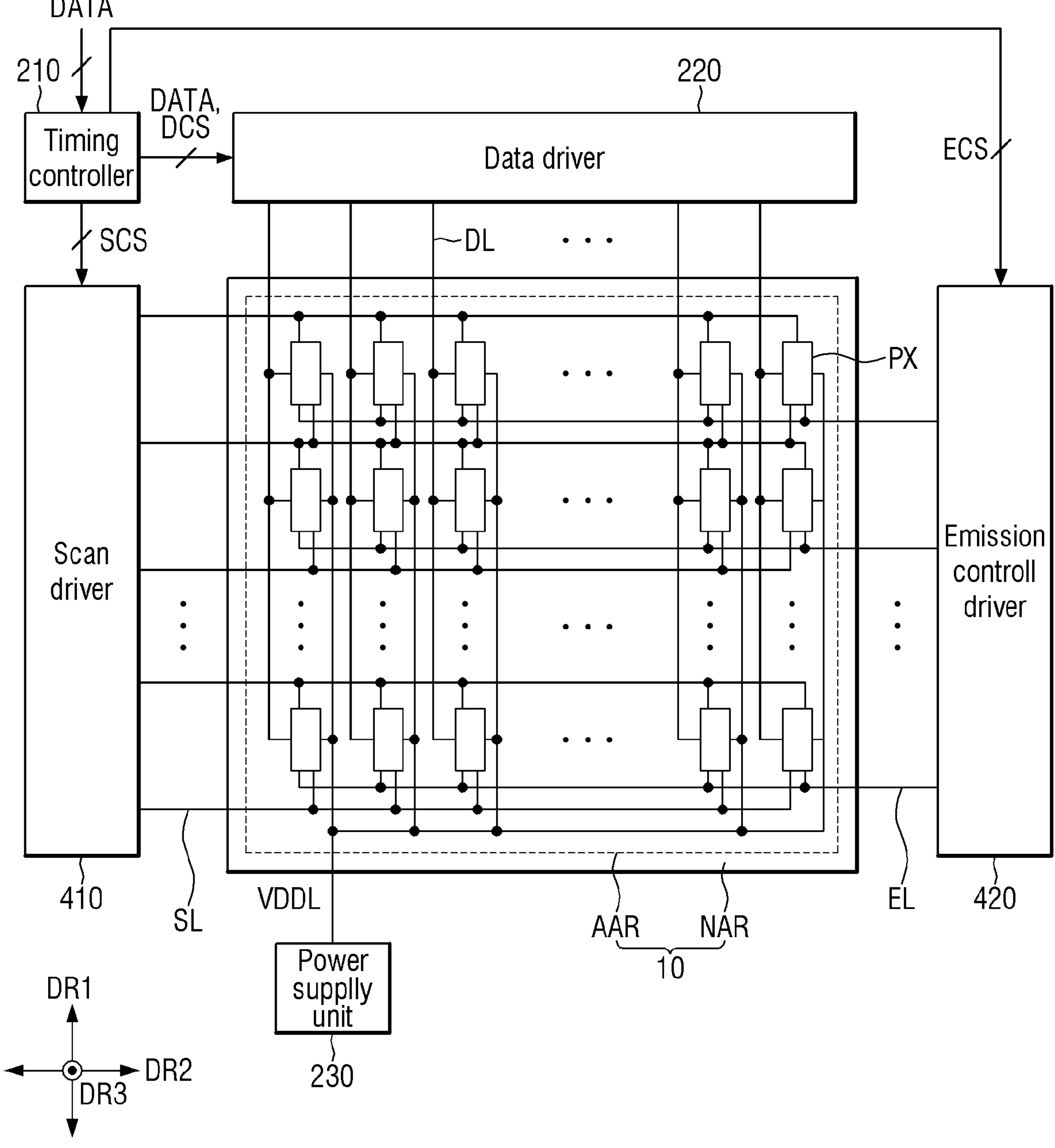
FIG. 3 is a block diagram showing a display device according to an embodiment of the disclosure.

FIG. 1 is a plan view showing a display device according to an embodiment of the disclosure. FIG. 2 is a plan view showing a display device according to an embodiment of the disclosure. FIG. 3 is a block diagram showing a display device according to an embodiment of the disclosure.

As used herein, the terms "above," "top" and "upper surface" refer to the upper side of the display panel 10, i.e., the side indicated by the arrow in the z-axis direction, whereas the terms "below," "bottom" and "lower surface" refer to the lower side of the display panel 10, i.e., the opposite side in the z-axis direction. As used herein, the terms "left," "right," "upper" and "lower" sides indicate relative positions when the display panel 10 is viewed from the top.

Referring to FIGS. 1 to 3, a display device 1 is for displaying moving images or still images. The display device 1 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and a ultra-mobile PC (UMPC), as well as the display screen of various products such as a television, a notebook, a monitor, a billboard and the Internet of Things.

The display device 1 may be a light-emitting display device such as an organic light-emitting display device using organic light-emitting diodes, an inorganic light-emitting display device including an inorganic semiconductor, and a micro light-emitting display device using micro light-emitting diodes (LED). In the following description, an organic light-emitting display device is described as an example of the display device 1. It is, however, to be understood that the disclosure is not limited thereto.

The display device 1 includes a display panel 10, a display driver circuit 20 and a circuit board 30.

The display panel 10 may be formed in a rectangular plane having shorter sides in the second direction DR2 and longer sides in the first direction DR1 intersecting the second direction DR2. Each of the corners where the shorter side in the second direction DR2 meets the longer side in the second direction DR2 may be rounded with a predetermined curvature or may be a right angle. The shape of the display panel 10 when viewed from the top is not limited to a quadrangular shape, but may be formed in a different polygonal shape, a circular shape, or an elliptical shape. The display panel 10 may be formed to be flat, but not be limited to being flat. The display panel 10 may include curved portions formed at left and right ends thereof and have a constant or varying curvature. In addition, the display panel 10 may be flexible so that it can be curved, bent, folded or rolled.

The display panel 10 may include an active area AAR where pixels PX are formed to display images, and a non-active area NAR which is the peripheral area of the active area AAR.

The active area AAR may include a plurality of pixels PX; PX1, PX2 and PX3 (see FIG. 4). The pixels PX may be arranged in a matrix. The arrangement of the pixels PX will be described in detail later.

In the active area AAR, the scan lines SL connected to the pixels PX, emission lines EL, data lines DL and a first supply voltage line VDDL may be disposed besides the pixels PX. The scan lines SL and the emission lines EL may be formed in the second direction DR2, while the data lines DL may be formed in the first direction DR1 intersecting the second direction DR2. The first supply voltage line VDDL may be formed in parallel to the second direction DR2 in the active area AAR.

Each of the pixels PX may be connected to at least one of the scan lines SL, at least one of the data lines DL, at least one of the emission lines EL, and the first supply voltage line VDDL. In the example shown in FIG. 3, each of the pixels PX is connected to two scan lines SL, one data line DL, one emission line EL, and the first drive voltage line VDDL. It is, however, to be understood that the disclosure is not limited thereto. For example, each of the pixels PX may be connected to three scan lines SL rather than two scan lines SL.

Each of the pixels PX may include a driving transistor, at least one switching transistor, a light-emitting element, and a capacitor. The transistor may be turned on in response to a scan signal from a scan line SL, so that a data voltage from a data line DL may be applied to the gate electrode of the driving transistor DT (see FIG. 5). When the data voltage is applied to the gate electrode, the driving transistor DT may supply a driving current to the light-emitting element, so that light can be emitted. The driving transistor DT and the at least one switching transistor ST (see FIG. 5) may be thin-film transistors. The light-emitting element may emit light in accordance with the driving current supplied from the driving transistor DT. The light-emitting element may be an organic light-emitting diode including a first electrode, an organic emissive layer, and a second electrode. The capacitor can maintain the data voltage applied to the gate electrode of the driving transistor DT constant.

As shown in FIG. 2, the active area AAR may include an inner active area AAR_I and an outer active area AAR_L that includes a first outer active area AAR_L1 and a second outer active area AAR_L2. Specifically, the active area AAR may be divided into the inner active area AAR_I and the outer active area AAR_L depending on a configuration of the signal line which receive a data signal. The inner active area AAR_I and the outer active area AAR_L will be described later.

The bending region BR may be connected to a shorter side of the main region MR. The width of the bending region BR (in the second direction DR2) may be less than the width (width of the shorter side) of the main region MR. The portions where the main region MR meets the bending region BR may be cut in an L-shape in order to reduce the bezel width.

The sub-region SR extends from the bending region BR. The sub-region SR may extend in a direction parallel to the main region MR from the end of the bending region. The sub-region SR may overlap with the main region MR in the first direction DR1 of the display panel 10. The sub-region SR may overlap the non-active area NAR at the edge of the main region MR and may also overlap with the active area AAR of the main region MR. The width of the sub-region SR may be, but is not limited to being, equal to the width of the bending region BR.

A pad region PDR may be located on the sub-region SR of the display panel 10. An external device may be mounted on (or attached to) the pad region PDR. Examples of the external device include a display driver circuit 20, a driving board 30 implemented as a flexible printed circuit board or a rigid printed circuit board. Other line connection films, connectors, etc., may be mounted on the pad region as well. More than one external devices may be mounted on the sub-region SR. For example, as shown in FIGS. 1 and 2, the display driving chip 20 may be disposed in the sub-region SR of the display panel 10, and the driving board 30 may be attached to the end of the sub-region SR.

The display driver circuit 20 may be attached on the display panel 10 by an anisotropic conductive film or on the display panel 10 by ultrasonic bonding. The width of the display driver circuit 20 may be less than the width of the display panel 10 in the horizontal direction (the second direction DR2). The display driver circuit 20 may be disposed at the center of the sub-region SR in the horizontal direction (the second direction DR2), and the left and right edges of the display driver circuit 20 may be spaced apart from the left and right edges of the sub-region SR, respectively.

The display driver circuit 20 may include an integrated circuit for driving the display panel 10. In an embodiment, the integrated circuit may be, but is not limited to, a data driving integrated circuit that generates and provides data signals. The display driver circuit 20 is connected to wire pads PD disposed in the pad region PDR of the display panel to provide data signals to the wire pads PD. The connection wires CW connected to the wire pads extend toward the pixels PX to apply a data signal or the like to each pixel PX.

Between the data lines DL and the display driver circuit 20 in the non-active area NAR, the test unit 600 for checking a defect in spider lines (hereinafter, fan-out lines FOL) of the display panel 10 for transferring the outputs from the display driver circuit 20 to the pixels PX may be disposed.

Between the data lines DL and the display driver circuit 20, the test unit 600 for checking a defect in the fan-out lines FOL of the display panel 10 for transferring the outputs from the display driver circuit 20 to the pixels PX may be disposed. The fan-out lines FOL may connect the data lines DL with the display driver circuit 20.

Each of the fan-out lines FOL may be formed like a spider's web with the spacing of 5 to 10 micrometers (μm). In this instance, defects such as a short-circuit or an open-circuit may frequently occur due to foreign materials or the like between the fan-out lines FOL. Accordingly, it is necessary to check if there is a defect in the fan-out lines FOL, and a test unit may be disposed in the display device 1.

A scan driver circuit may be connected to the display driver circuit 20 through a plurality of scan control lines. The scan driver circuit may receive a scan control signal SCS and an emission control signal ECS from the display driver circuit 20 through the scan control lines.

The scan driver circuit may include a scan driver 410 and an emission control driver 420 as shown in FIG. 3.

The scan driver 410 may generate scan signals according to the scan control signal SCS and may sequentially output the scan signals to the scan lines SL. The emission control driver 420 may generate the emission control signals according to the emission control signal ECS and may sequentially output the emission control signals to the emission lines EL.

The display driver circuit 20 may include a timing controller 210, a data driver 220, and a power supply unit 230.

The timing controller 210 receives digital video data DATA and timing signals from the circuit board 30. The timing controller 210 may generate the scan control signal SCS for controlling the operation timing of the scan driver 410 according to the timing signals, may generate the emission control signal ECS for controlling the operation timing of the emission control driver 420 and may generate the data control signal DCS for controlling the operation timing of the data driver 220. The timing controller 210 may output the scan control signal SCS to the scan driver 410 through the scan control lines and may output the emission control signal ECS to the emission control driver 420. The timing controller 210 may output the digital video data DATA and the data control signal DCS to the data driver 220.

The data driver 220 converts the digital video data DATA into analog data voltages and supplies them to the data lines DL. Data driver 220 may supply analog data voltages to the data lines DL in the outer active area AAR_L through the fan-out lines FOL. The pixels PX are selected by the scan signals of the scan driving circuit, and the data voltages are supplied to the selected pixels PX.

The power supply unit 230 may generate a first supply voltage to supply it to the first supply voltage line VDDL. In addition, the power supply unit 230 may generate a second supply voltage to supply it to the cathode electrode of the organic light-emitting diode of each of the pixels PX. The first driving voltage may be a high-level voltage for driving the organic light-emitting diode, and the second driving voltage may be a low-level voltage for driving the organic light-emitting diode. That is to say, the first driving voltage may have a higher level than that of the second driving voltage.

The display driver circuit 20 may be implemented as an integrated circuit (IC) and may be attached to the display panel 10 by a chip on glass (COG) technique. It should be understood, however, that the disclosure is not limited thereto. The display driver circuit 20 may be implemented as an integrated circuit (IC) and may be attached to the display panel or the circuit board 30 by a chip on plastic (COP) technique, a chip on glass (COG) technique, etc. In the following description, the display driver circuit 20 is implemented as an integrated circuit (IC) and attached to the display panel 10 by the chip on plastic (COP) technique, as an example.

The circuit board 30 may be attached to display pads PAD, for example, using an anisotropic conductive film. In this manner, the lead lines of the circuit board 30 may be electrically connected to the display pads PAD. As another example, the circuit board 30 may be attached directly to the display pads PAD by using ultrasonic bonding. The circuit board 30 may be a flexible printed circuit board, a printed circuit board, or a flexible film such as a chip on film. In some embodiments, lighting test, crack test, and fan-out line test may be carried out to the display panel 10 before the circuit board 30 is attached thereto. When the lighting test, the crack test, and the fan-out line test are carried out, a circuit board for testing may be attached to the display pad PAD. The circuit board for testing may supply signals necessary for the lighting test, the crack test, and the fan-out line test of the display panel 10.

In addition, one ends of the fan-out lines FOL may be connected to the data lines DL disposed in the outer active area AAR_L, and the other ends of the fan-out lines FOL may be connected to the test unit 600. The test unit 600 may check a defect such as a short-circuit and an open-circuit in the fan-out lines FOL. As such, the test unit 600 may check a defect in the fan-out lines FOL. The test for checking a defect in the fan-out lines FOL by the test unit 600 will be described later.

Figure 4:
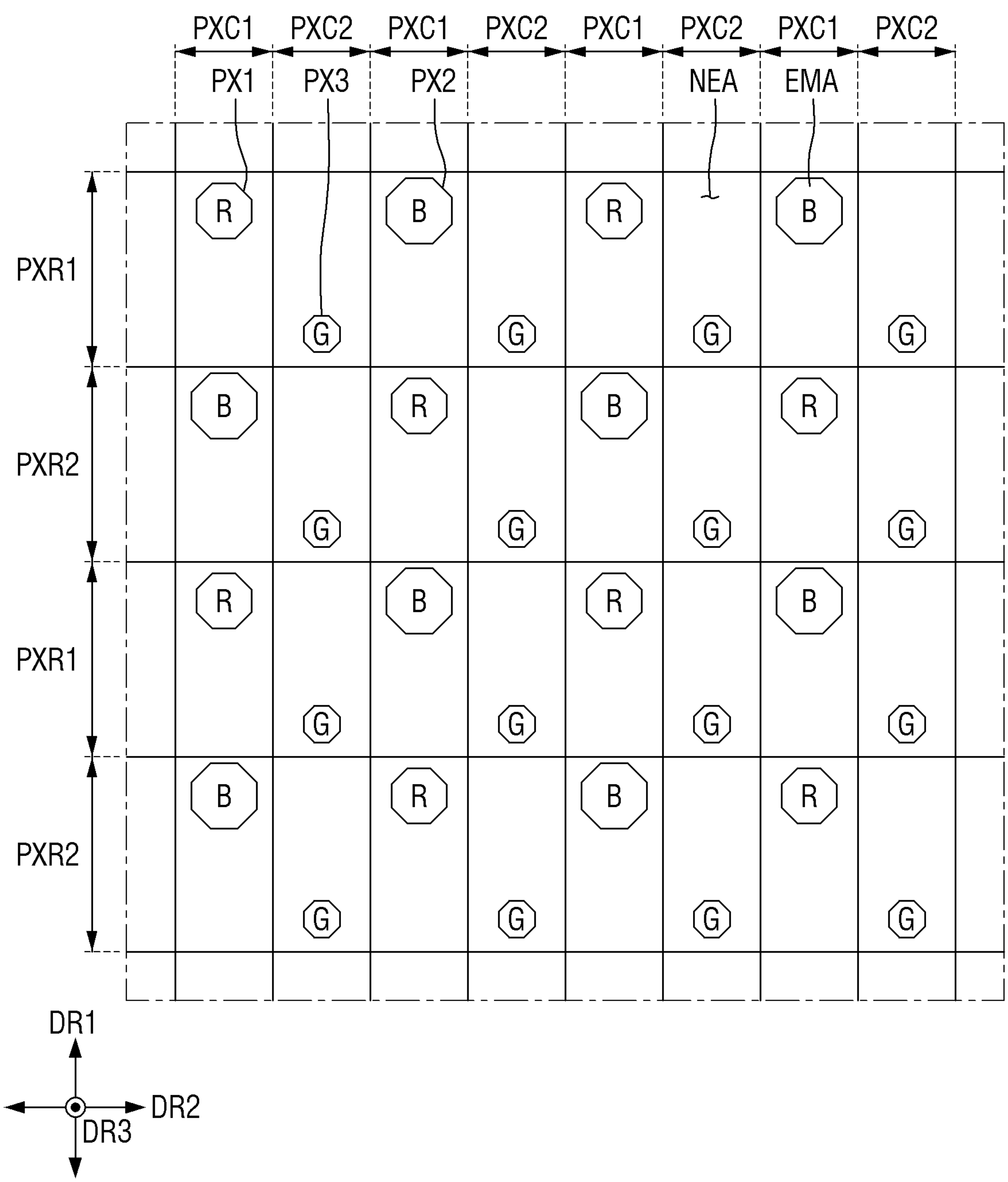
FIG. 4 is a view showing a layout of pixels of a display device according to an embodiment of the disclosure.

FIG. 4 is a view showing a layout of pixels of a display device according to an embodiment of the disclosure.

Referring to FIG. 4, the pixels PX may include first color pixels PX1, second color pixels PX2 and third color pixels PX3. According to an embodiment of the disclosure, the first color pixels PX1 may be red pixels, the second color pixels PX2 may be blue pixels, and the third color pixels PX3 may be green pixels. The pixels PX may be arranged sequentially and repeatedly to form a matrix.

Each of the pixels PX may include an emission area EMA and a non-emission area NEA surrounding the emission area EMA. The emission areas EMA of the color pixels PX1, PX2 and PX3 may have different sizes. For example, the emission area EMA of each of the second color pixels PX2 may be larger than the emission area EMA of each of first color pixels PX1, and the emission area EMA of each of the third color pixels PX3 may be smaller than the emission area EMA of each of the first color pixels PX1. The shape of the emission area EMA of each of the pixels may be, but is not limited to, generally an octagonal shape. The emission area EMA may have a hexagonal shape, a circular shape, a diamond shape or other polygonal shape, a polygonal shape with rounded corners, etc.

In some of the pixel columns PXC (hereinafter, a first pixel column PXC1) the first color pixels PX1 and the second color pixels PX2 are alternately arranged in the first direction DR1 (the column direction). In some other pixel columns PXC (hereinafter, second pixel columns PXC2), the third color pixels PX3 are repeatedly arranged. The first pixel columns PXC1 and the second pixel columns PXC2 are alternately arranged in the second direction DR2 (row direction). For example, the odd-numbered pixel columns PXC may be the first pixel columns PXC1, and the even-numbered pixel columns PXC may be the second pixel columns PXC2.

The emission areas EMA belonging to one pixel column PXC may be generally aligned with one another in the first direction DR1. The emission areas EMA of one pixel column PXC and the emission areas EMA of the neighboring pixel column PXC may be staggered. For example, the first color pixels PX1 and the second color pixels PX2 of the first pixel columns PXC1 may be aligned in the first direction DR1. The third color pixels PX3 of the second pixel columns PXC2 may not be aligned with the first color pixels PX1 or the second color pixel PX2 in the second direction DR2. In each of the pixel rows PXR, the first color pixels PX1 and the second color pixels PX2 are alternately arranged, with the third color pixels PX3 disposed therebetween. In the first pixel row PXR1, a first color pixel PX1, a third color pixel PX3, a second color pixel PX2 and a third color pixel PX3 are repeatedly arranged as a unit. In the second pixel row PXR2, a second color pixel PX2, a third color pixel PX3, a first color pixel PX1 and a third color pixel PX3 are repeatedly arranged as a unit. The first pixel rows PXR1 and the second pixel rows PXR2 are alternately arranged in the first direction DR1 (column direction). For example, the odd-numbered pixel rows PXR may be the first pixel rows PXR1, and the even-numbered pixel rows PXR may be the second pixel rows PXR2. In a pixel row PXR, the emission area EMA of the first color pixel PX1 and the emission area EMA of the second color pixel PX2 may be disposed closer to one side of the pixel row PXR in the first direction DR1 than the emission area EMA of the third color pixel PX3. In other words, the emission areas EMA of the pixels PX in a pixel row PXR may be arranged in a zigzag pattern in the second direction DR2.

The pixels PX belonging to the same column may receive a data signal from the same data line, and pixels PX belonging to the same row may receive a gate signal from the same gate line. Each of the pixels PX may be driven by a pixel circuit. The pixel circuit may include a plurality of transistors and at least one capacitor.

Figure 5:
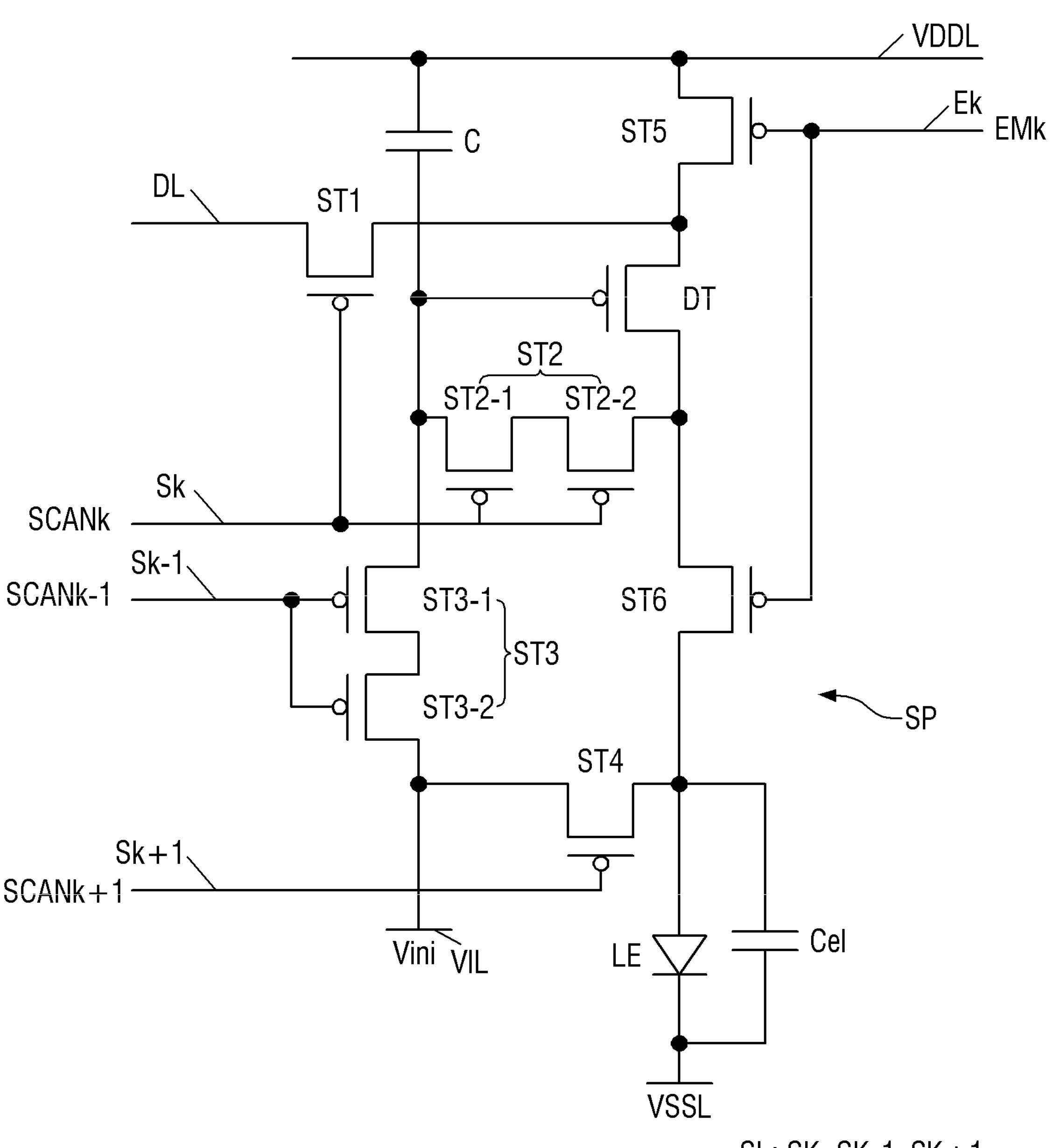
FIG. 5 is a circuit diagram of one pixel of a display device according to an embodiment of the disclosure.

FIG. 5 is a circuit diagram of one pixel of a display device according to an embodiment of the disclosure.

Referring to FIG. 5, a pixel PX may be connected to a (k−1)th scan line S(k−1) to which a $(k-1)^{th}$ scan signal SCAN(k−1) is applied, a $k^{th}$ scan line Sk to which a $k^{th}$ scan signal SCANk is applied, a $(k+1)^{th}$ scan line S(k+1) to which a $(k+1)^{th}$ scan signal SCAN(k+1) is applied, and a jth data line Dj, where k is a positive integer equal to or greater than two and j is a positive integer. In addition, the pixel PX may be connected to a first supply voltage line VDDL from which the first driving voltage is supplied, an initializing voltage line VIL from which an initializing voltage Vini is supplied, and a second supply voltage line VSSL from which the second driving voltage is supplied.

The pixel PX includes a driving transistor DT, a light-emitting element LE, switch elements and a capacitor C. The switch elements include first to sixth transistors ST1, ST2, ST3, ST4, ST5 and ST6.

The drain-source current Ids (hereinafter referred to as "driving current") of driving transistor DT is controlled according to the data voltage applied to a gate electrode of the driving transistor DT. The driving current Ids flowing through the channel of the driving transistor DT is proportional to the square of the difference between the gate-source voltage Vgs and the threshold voltage Vth of the driving transistor DT.

The light-emitting element LE emits light as the driving current Ids flows therethrough. The amount of the light emitted from the light-emitting element LE may be proportional to a driving current Ids.

The light-emitting element LE may be an organic light-emitting diode including an anode electrode, a cathode electrode, and an organic emissive layer disposed between the anode electrode and the cathode electrode. Alternatively, the light-emitting element LE may be an inorganic light-emitting element including an anode electrode, a cathode electrode, and an inorganic semiconductor disposed between the anode electrode and the cathode electrode. Alternatively, the light-emitting element LE may be an quantum-dot light-emitting element including an anode electrode, a cathode electrode, and a quantum-dot emissive layer disposed between the anode electrode and the cathode electrode. Alternatively, the light-emitting element LE may be a micro light-emitting diode.

The anode electrode of the light-emitting element LE may be connected to the first electrode of the fourth transistor ST4 and the second electrode of the sixth transistor ST6, while the cathode electrode thereof may be connected to the second supply voltage line VSSL. A parasitic capacitance Cel may be formed between the anode electrode and the cathode electrode of the light-emitting element LE.

The first transistor ST1 is turned on by the scan signal of the $k^{th}$ scan line Sk to connect the first electrode of the drive transistor DT with the jth data line Dj. The gate electrode of the first transistor ST1 may be connected to the $k^{th}$ scan line Sk, the first electrode thereof may be connected to the first electrode of the driving transistor DT, and the second electrode thereof may be connected to the data line Dj.

The second transistor ST2 may be implemented as a dual transistor including a (2-1) transistor ST2-1 and a (2-2) transistor ST2-2. The (2-1) transistor ST2-1 and the (2-2) transistor ST2-2 are turned on by the scan signal from the $k^{th}$ scan line Sk to connect the gate electrode of the drive transistor DT with the second electrode of the drive transistor DT. That is to say, when the (2-1) transistor ST2-1 and the (2-2) transistor ST2-2 are turned on, the gate electrode of the driving transistor DT is connected to the second electrode of the driving transistor DT, and thus the driving transistor DT is diode connected. The gate electrode of the (2-1) transistor ST2-1 may be connected to the $k^{th}$ scan line Sk, the first electrode thereof may be connected to the second electrode of the (2-2) transistor ST2-2, and the second electrode thereof may be connected to the gate electrode of the driving transistor DT. The gate electrode of the (2-2) transistor ST2-2 may be connected to the $k^{th}$ scan line Sk, the first electrode thereof may be connected to the second electrode of the driving transistor DT, and the second electrode thereof may be connected to the first electrode of the (2-2) transistor ST2-2.

The third transistor ST3 may be implemented as a dual transistor including a (3-1) transistor ST3-1 and a (3-2) transistor ST3-2. The (3-1) transistor ST3-1 and the (3-2) transistor ST3-2 are turned on by the scan signal of the $(k-1)^{th}$ scan line S(k−1) to connect the gate electrode of the drive transistor DT with the initialization voltage line VIL. The gate electrode of the driving transistor DT may be discharged to the initializing voltage Vini of the initializing voltage line VIL. The gate electrode of the (3-1) transistor ST3-1 may be connected to the $(k-1)^{th}$ scan line S(k−1), the first electrode thereof may be connected to the gate electrode of the driving transistor DT, and the second electrode thereof may be connected to the first electrode of the (3-2) transistor ST3-2. The gate electrode of the (3-2) transistor ST3-2 may be connected to the $(k-1)^{th}$ scan line S(k−1), the first electrode thereof may be connected to the second electrode of the (3-1)transistor ST3-1, and the second electrode thereof may be connected to the initialization voltage line VIL.

The fourth transistor ST4 is turned on by the scan signal of the (k+1) th scan line S(k+1) to connect the anode electrode of the light-emitting element LE and the initialization voltage line VIL. The anode electrode of the light-emitting element LE may be discharged to the initializing voltage. The gate electrode of the fourth transistor ST4 is connected to the $(k+1)^{th}$ scan line S(k+1), the first electrode thereof is connected to the anode electrode of the light-emitting element LE, and the second electrode thereof is connected to the initializing voltage line VIL.

The fifth transistor ST5 is turned on by the emission control signal of the $k^{th}$ emission line Ek to connect the first electrode of the driving transistor DT with the first supply voltage line VDDL. The gate electrode of the fifth transistor ST5 is connected to the $k^{th}$ emission line Ek, the first electrode thereof is connected to the first supply voltage line VDDL, and the second electrode thereof is connected to the first electrode of the driving transistor DT.

The sixth transistor ST6 is connected between the second electrode of the driving transistor DT and the anode electrode of the light-emitting element EL. The sixth transistor ST6 is turned on by the emission control signal of the $k^{th}$ emission line Ek to connect the second electrode of the driving transistor DT with the anode electrode of the light-emitting element LE. The gate electrode of the sixth transistor ST6 is connected to the $k^{th}$ emission line Ek, the first electrode thereof is connected to the second electrode of the driving transistor DT, and the second electrode thereof is connected to the anode electrode of the light-emitting element LE. When the fifth transistor ST5 and the sixth transistor ST6 both are turned on, the driving current Ids can be supplied to the light-emitting emitting element LE.

The capacitor C is formed between the gate electrode of the driving transistor DT and the first supply voltage line VDDL. One electrode of the capacitor C may be connected to the gate electrode of the driving transistor DT while the other electrode thereof may be connected to the first supply voltage line VDDL. The capacitor C may hold the voltage at the gate electrode of the driving transistor DT for one frame.

When the first electrode of each of the first to sixth transistors ST1, ST2, ST3, ST4, ST5 and ST6 and the driving transistor DT is a source electrode, the second electrode thereof may be a drain electrode. When the first electrode of each of the first to sixth transistors ST1, ST2, ST3, ST4, ST5 and ST6 and the driving transistor DT is a drain electrode, the second electrode thereof may be a source electrode.

Figure 6:
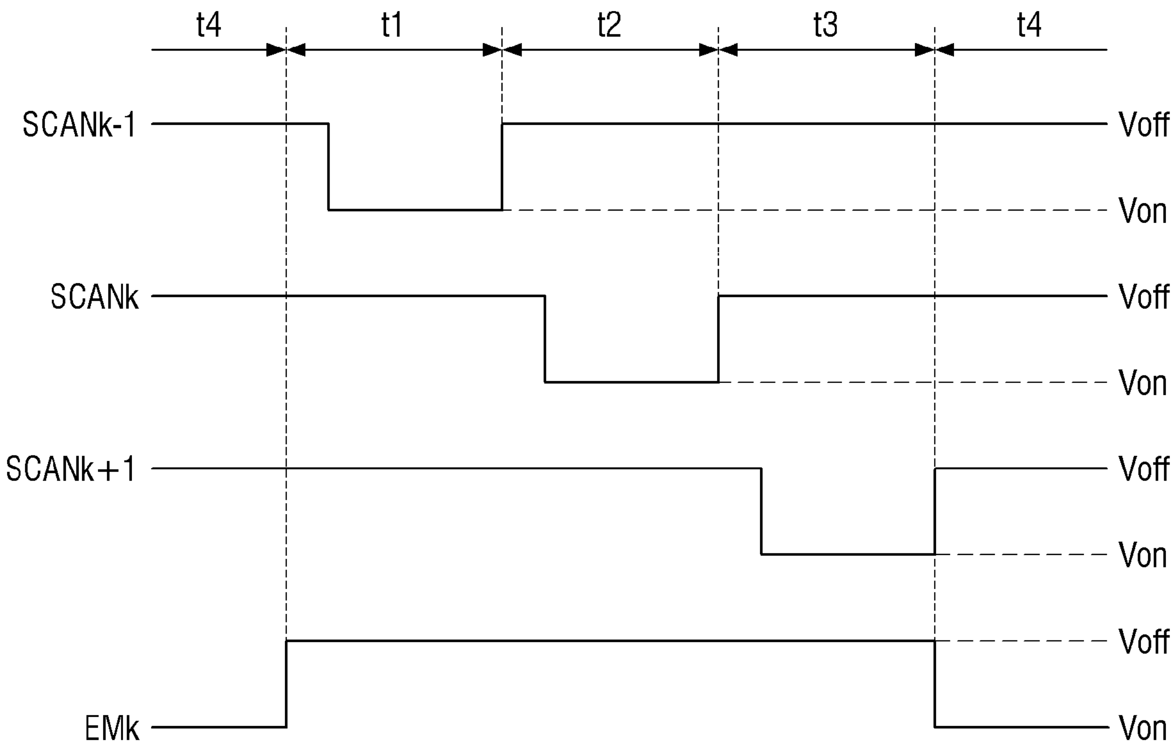
FIG. 6 is a timing diagram showing signals applied to lines of FIG. 5.

FIG. 6 is a timing diagram showing signals applied to lines of FIG. 5.

Referring to FIG. 6, the $(k-1)^{th}$ scan signal SCAN(k−1) applied to the $(k-1)^{th}$ scan line S(k−1) is used to turn on and turn off the third transistor ST3. The $k^{th}$ scan signal SCANk applied to the $k^{th}$ scan line Sk is used to turn on and turn off each of the first transistor ST1 and the second transistor ST2. The $(k+1)^{th}$ scan signal SCAN(k+1) applied to the $(k+1)^{th}$ scan line S(k+1) is used to turn on and turn off the fourth transistor ST4. The $k^{th}$ emission signal EMk is used to control the fifth transistor ST5 and the sixth transistor ST6.

The $(k-1)^{th}$ scan signal SCAN(k−1), the $k^{th}$ scan signal SCANk, the $(k+1)^{th}$ scan signal SCAN(k+1), and the $k^{th}$ emission signal EMk may be generated at every one frame period. One frame period may be divided into first to fourth periods t1 to t4. During the first period t1, the gate electrode of the driving transistor DT is initialized. During the second period t2, the data voltage is supplied to the gate electrode of the driving transistor DT, and the threshold voltage of the driving transistor DT is sampled. During the third period t3, the anode electrode of the light-emitting element LE is initialized. During the fourth period t4, the light-emitting element LE emits light.

The (k−1)'h scan signal SCAN(k−1), the $k^{th}$ scan signal SCANk and the $(k+1)^{th}$ scan signal SCAN(k+1) may be output sequentially during the first to third periods t1, t2 and t3 as a gate-on voltage Von. For example, the $(k-1)^{th}$ scan signal SCAN(k−1) may have a gate-on voltage Von during the first period t1 and may have a gate-off voltage Voff during the other periods. The $k^{th}$ scan signal SCANk may have the gate-on voltage Von during the second period t2 and may have the gate-off voltage Voff during the other periods. The $(k+1)^{th}$ scan signal SCAN(k+1) may have the gate-on voltage Von during the third period t3 and may have the gate-off voltage Voff during the other periods. Although the period in which the $(k-1)^{th}$ scan signal SCAN(k−1) has the gate-on voltage Von is shorter than the first period t1 in the graph shown in FIG. 6, the period may be substantially equal to the first period t1. Although the period in which the $k^{th}$ scan signal SCANk has the gate-on voltage Von is shorter than the second period t2 in the graph shown in FIG. 5, the period may be substantially equal to the second period t2. In addition, although the period in which the $(k+1)^{th}$ scan signal SCAN(k+1) has the gate-on voltage Von is shorter than the third period t3 in the graph shown in FIG. 5, the period may be substantially equal to the third period t3.

The $k^{th}$ emission signal EMk may have the gate-on voltage Von during the fourth period t4 and may have the gate-off voltage Voff during the other periods.

Figure 7:
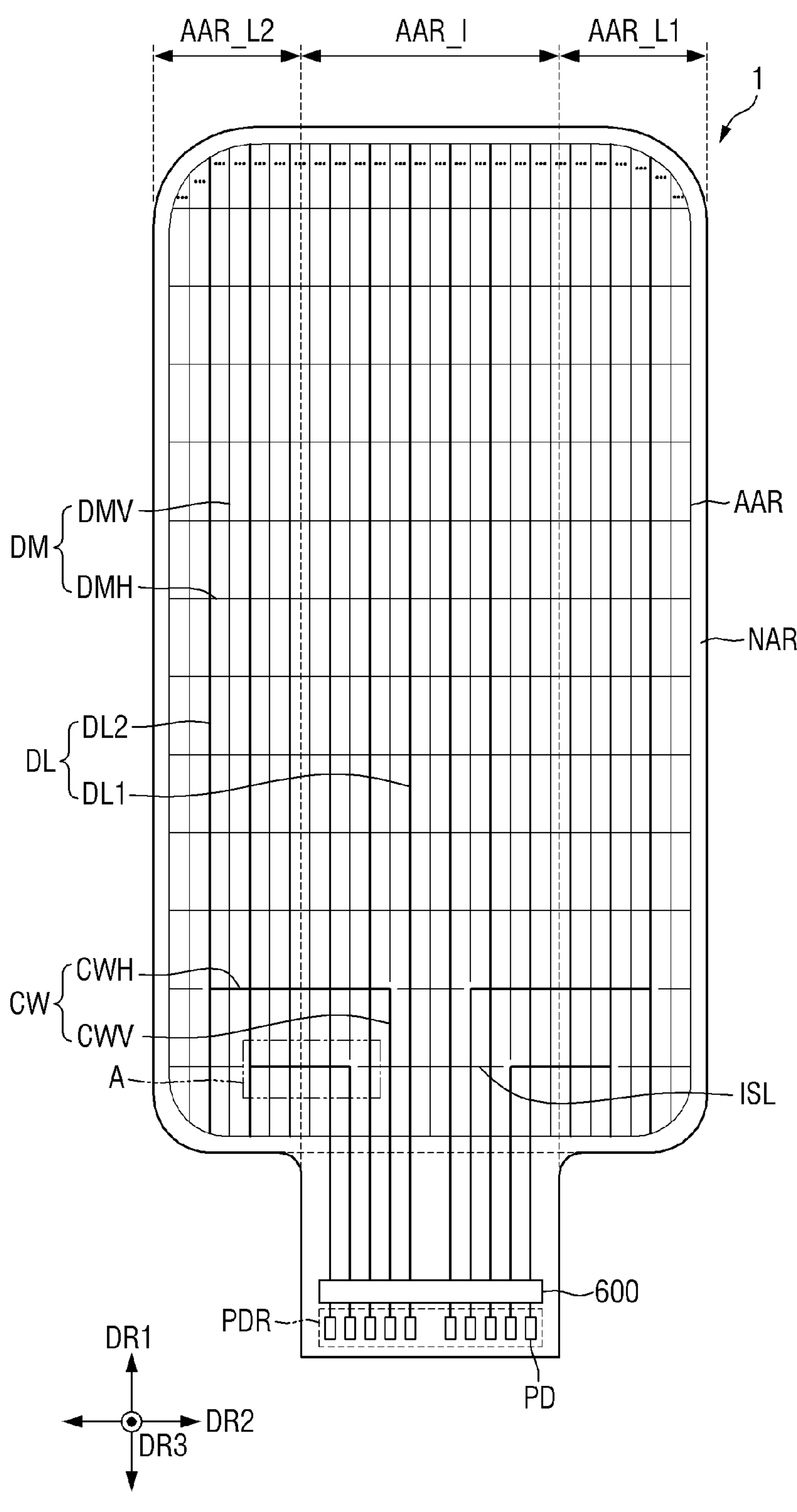
FIG. 7 is a view showing a layout of data lines, connection lines, and constant-voltage lines of a display device according to an embodiment.
Figure 8:
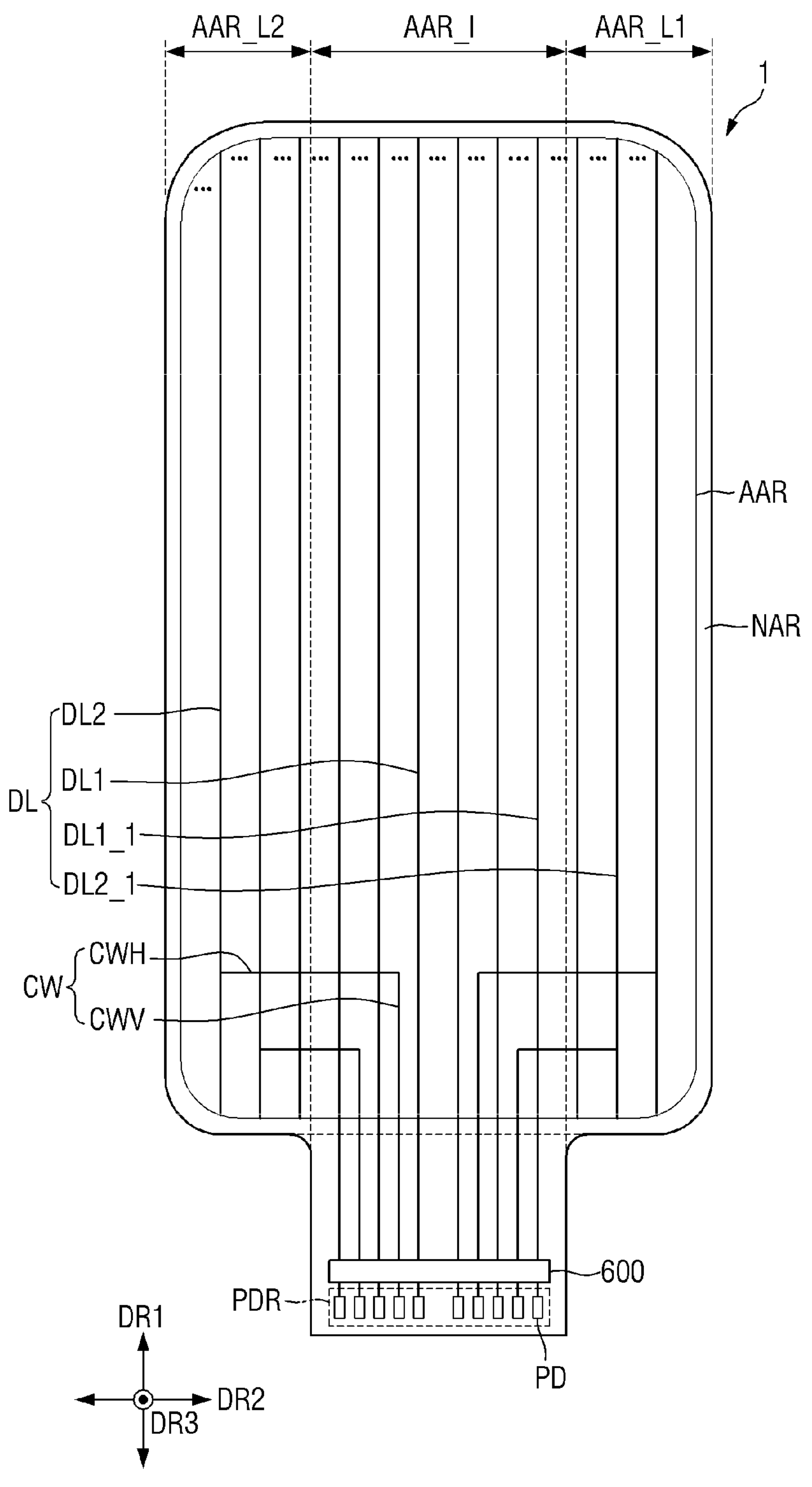
FIG. 8 is a view showing a layout of data lines and connection lines of FIG. 7.
Figure 9:
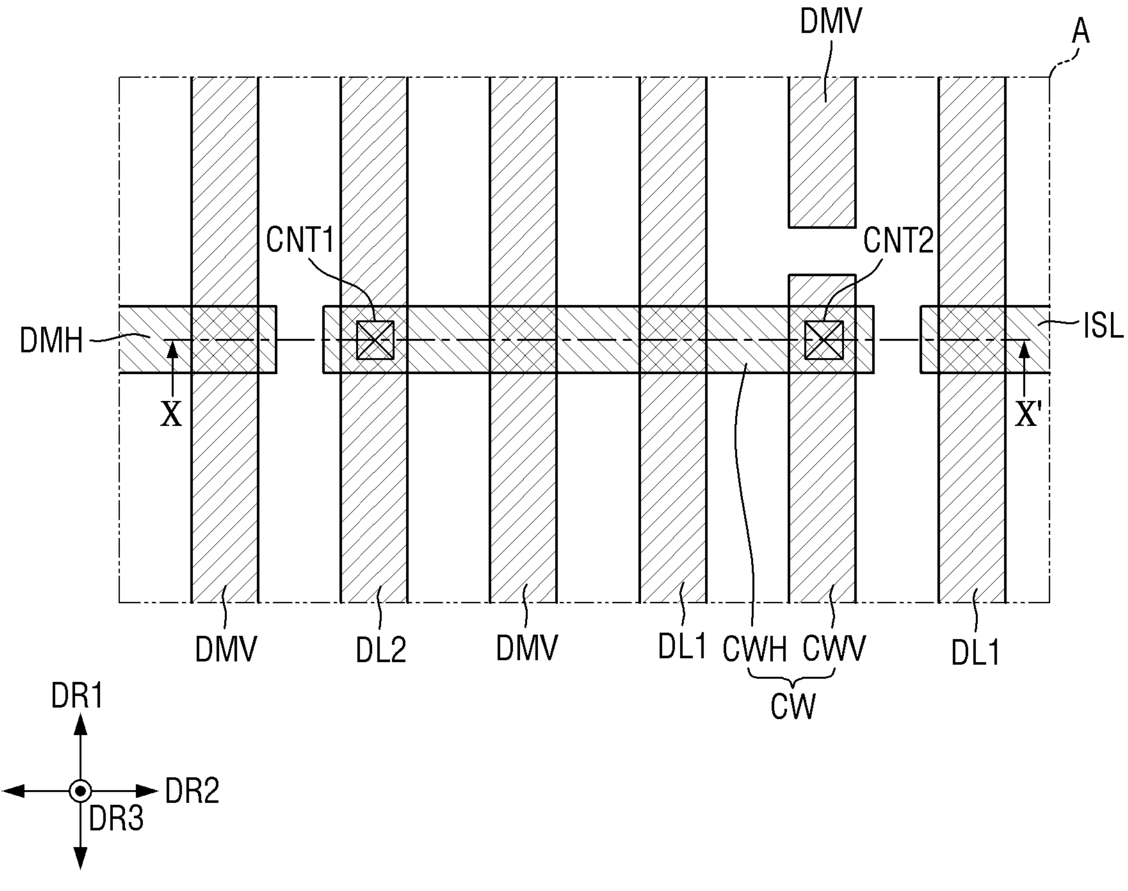
FIG. 9 is an enlarged plan view of area A of FIG. 7.
Figure 10:
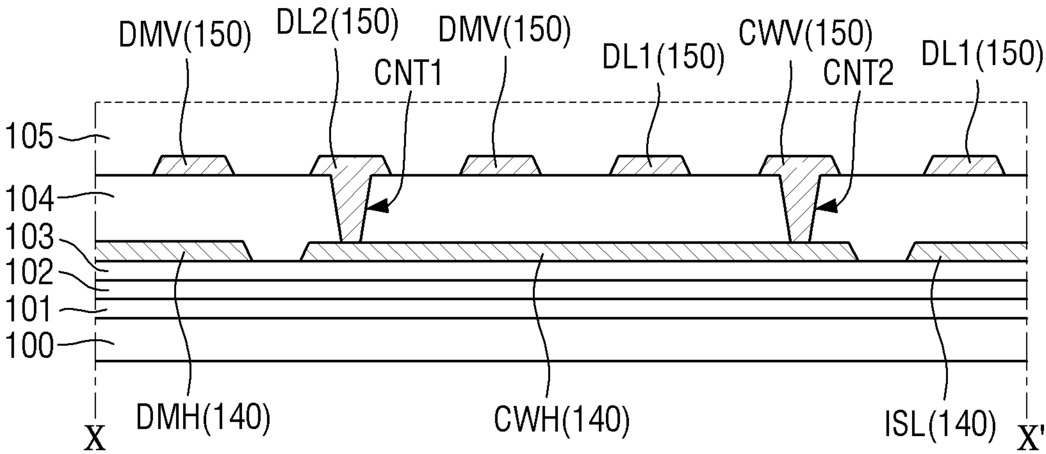
FIG. 10 is a cross-sectional view taken along line X-X' of FIG. 9.
Figure 10:
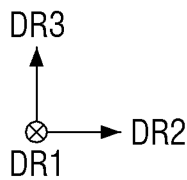

Each of the pixels PX according to the embodiment may emit light in response to the $(k-1)^{th}$ scan signal SCAN(k−1), the $k^{th}$ scan signal SCANk, the $(k+1)^{th}$ scan signal SCAN (k+1), and the $k^{th}$ emission signal EMk. FIG. 7 is a view showing a layout of data lines, connection lines, and constant-voltage lines of a display device according to an embodiment. FIG. 8 is a view showing a layout of data lines and connection lines of FIG. 7. FIG. 9 is an enlarged plan view of area A of FIG. 7. FIG. 10 is a cross-sectional view taken along line X-X' of FIG. 9.

Referring to FIGS. 7 to 10, the display panel may include the data lines DL extending in the first direction DR1 and arranged in the second direction DR2, the connection wires CW electrically connecting the wire pads PD of the pad region PDR to the data lines in the outer active areas AAR_L, and the constant-voltage lines DM from which a constant voltage is applied.

Referring to FIGS. 7 and 8, the width of the active area AAR including the inner active area AAR_I and the outer active area AAR_L which includes a first outer active area AAR_L1 and a second outer active area AAR_L2 in the second direction DR2 may be greater than the width of the row of the wire pads PD arranged in the pad region PDR in the second direction DR2. The connection wires CW may extend from the active area AAR to the non-active area NAR.

For example, when the display device 1 is cut in an L-shape, some of the wire pads PD may be connected directly to the data lines DL while the others of the wire pads PD may be connected to the data lines DL via the connection wires in the active area AAR. Accordingly, the inner active area AAR_I may be defined as the area where the data lines DL are connected directly to the pads in the pad region PDR. In addition, the inner active area AAR_I may be defined as an area of the active area AAR which is overlapped with the pad region PDR of the non-active area NAR in the first direction DR1. The outer active areas AAR_L may be defined as areas of the active area AAR which is not overlapped with the pad region PDR of the non-active area NAR in the first direction DR1. The data lines DL in the outer active areas AAR_L are connected to the pad region PDR via connection wires CW.

Although the inner active area AAR_I is located at the center of the active area AAR, the first outer active area AAR_L1 is located on one side of the inner active area AAR_I in the second direction DR2, and the second outer active area AAR_L2 is located on the other side of the inner active area AAR_I in the second direction DR2 in FIG. 6, the disclosure is not limited thereto. The number and positions of the inner active area AAR_I and the outer active areas AAR_L may vary depending on the position of the row of the wire pads PD of the pad region PDR.

The first data lines DL1 in the inner active area AAR_I may extend from the non-active area NAR adjacent to the inner active area AAR_I (i.e., the inner non-active area NAR) in the first direction DR1, and may be disposed adjacent to the pixels in the inner active area AAR_I to apply signals. On the other hand, the second data lines DL2 in the outer active areas AAR_L may extend in the first direction DR1 and be connected to the display driving chip 20 via the connection wires CW and may be disposed adjacent to the pixels in the outer active areas AAR_L to apply signals.

The connection wires CW may include a first connection wire CWH extending in the second direction DR2 and a second connection wire CWV extending in the first direction DR1. The second connection wire CWV may extend to the non-active area NAR adjacent to the outer active area AAR_L (i.e., the outer non-active area NAR) through the inner active area AAR_I. The first data lines DL1 in the inner active area AAR_I are disposed in the active area AAR through which the first and second connection wires CWH and CWV pass. Accordingly, in order to avoid a short circuit between the connection wires CW and the first data lines DL1, the first connection wire CWH may be formed of a conductive layer disposed on a different plane from the data lines DL in the active area AAR.

Referring to FIGS. 7 to 10, the data lines DL may include a first data line DL1 disposed in the inner active area AAR_I and a second data line DL2 disposed in the outer active area AAR_L. More than one first data lines DL1 and more than one second data lines DL2 may be provided. The first data lines DL1 and the second data lines DL2 may be formed of a second data conductive layer 150. The first data lines DL1 may be connected directly to the wire pads PD in the pad region PDR, and the second data lines DL2 may be electrically connected to the wire pads PD in the pad region PDR through the connection wires CW. Although not limited thereto, the first data lines DL1 may be disposed near the center of the display device 1, while the second data lines DL2 may be disposed near the edges of the display device 1 in the second direction DR2. For example, the first data lines DL1 may extend in the first direction DR1 from the wire pads PD in the pad region PDR, and the second data lines DL2 may be disposed on one side and the other side of the first data line DL1 in the second direction DR2.

The connection wires CW connect the second data lines DL2 with the wire pads PD in the pad region PDR. More than one connection wires CW may be provided. Each of the connection wires CW may include a first connection wire CWV extending in the first direction DR1, and a second connection wire CWH extending in the second direction DR2. The first connection wire CWV and the second connection wire CWH of each of the connecting wires CW may be electrically connected to each other. One end of the first connection wire CWV may be electrically connected to the wire pads PD in the pad region PDR, and the other end of the first connection wire CWV may be electrically connected to the second connection wire CWH. One end of the second connection wire CWH may be electrically connected to the first connection wire CWV, and the other end of the second connection wire CWH may be electrically connected to the second data line DL2. That is to say, the second data line DL2 may be electrically connected to the wire pads PD in the pad region PDR through the connection wires CW.

The first connecting wire CWV and the second connecting wire CWH may be formed of different conductive layers. For example, the first connection wire CWV may be formed of the second data conductive layer 150, and the second connection wire CWH may be formed of a first data conductive layer 140. It is, however, to be understood that the disclosure is not limited thereto. In this instance, even though the second connection wire CWH crosses the data lines DL, they may be electrically insulated from each other by the fourth insulating layer 104.

Even though the first connection wire CWV and the second connection wire CWH are formed of different conductive layers, the first connection wire CWV and the second connection wire CWH may be electrically connected with each other through a contact hole CNT2 formed through the fourth insulating layer 104. Even though the second connection wire CWH and the second data lines DL2 are formed of different conductive layers, the second connection wire CWH and the second data lines DL2 may be electrically connected with each other through a contact hole CNT1 formed through the fourth insulating layer 104.

At least a part of the connection wires CW may be disposed in the active area AAR. A portion (the contact hole CNT1) where the second data lines DL2 are electrically connected to the connection wires CW may be disposed in the active area AAR. The connection wires CW electrically connecting the wire pads PD in the pad region PDR with the second data lines DL2 may be at least partially disposed in the active area AAR. As the connection wires CW does not extend along the non-active area NAR, but are at least partially disposed in the active area AAR, the width of the non-active area NAR can be reduced. Accordingly, users can get better immersed in contents displayed on the display device, and the other lines disposed in the non-active area NAR can be more easily disposed.

The constant-voltage lines DM may include a first constant-voltage line DMV extended in the first direction DR1, and a second constant-voltage line DMH extended in the second direction DR2. More than one first constant-voltage lines DMV and more than one second constant-voltage lines DMH may be provided. The first constant-voltage lines DMV may extend in the first direction DR1 and be arranged in the second direction DR2, and the second constant-voltage lines DMH extend in the second direction DR2 and may be arranged in the first direction DR1.

The constant-voltage lines DM may be separated from, spaced apart from and electrically insulated from the connection wires CW and the data lines DL. The constant-voltage lines DM may extend in the same direction as the connection wires CW or may be located on the extension lines of the connection wires CW. In other words, at least a part of the first constant-voltage lines DMV may extend in the first direction DR1 in which the first connection wire CWV extend, and may be located on the extension lines of the first connection wire CWV. At least a part of the second constant-voltage lines DMH may extend in the second direction DR2 in which the second connection wire CWH extend, and may be located on the extension lines of the second connection wire CWH.

The first constant-voltage lines DMV disposed on the extension lines of the first connection wire CWV may be separated from, spaced apart from and electrically insulated from the first connection wire CWV. At least a part of the second constant-voltage lines DMH may extend in the second direction DR2 in which the second connection wire CWH extend, and may be located on the extension lines of the second connection wire CWH. The second constant-voltage line DMH disposed on the extension line of the second connecting wire CWH may be separated from, spaced apart from and electrically insulated from the second connection wire CWH.

The first constant-voltage lines DMV and the second constant-voltage lines DMH may be formed of different conductive layers. The first constant-voltage lines DMV may be formed of the same conductive layer as the first connection wires CWV, while the second constant-voltage lines DMH may be formed of the same conductive layer as the second connection wires CWH. For example, the first constant-voltage lines DMV may be formed of the second data conductive layer 150, and the second constant-voltage lines DMH may be formed of the first data conductive layer 140. It is, however, to be understood that the disclosure is not limited thereto. In this instance, even though the second constant-voltage lines DMH cross the data lines DL and/or the first constant-voltage lines DMV, they may be electrically insulated from each other by the fourth insulating layer 104.

In addition, the first constant-voltage lines DMV may be disposed on the same conductive layer as the first connection wires CWV, while the second constant-voltage lines DMH may be disposed on the same conductive layer as the second connection wires CWH. For example, the first constant-voltage lines DMV may be disposed directly on the fourth insulating layer 104 together with the first connection wires CWV, while the second constant-voltage lines DMH may be disposed directly on the third insulating layer 103 together with the second connection wires CWH.

The display device 1 may further include a mesh pattern in the active area AAR. The mesh pattern may include the constant-voltage lines DM and the connection wires CW. In other words, the constant-voltage lines DM and the connection wires CW may form the mesh pattern throughout the entire area of the active area AAR. In the active area AAR, by disposing the constant-voltage lines DM where the connection wires CW are not disposed, the mesh pattern may be disposed throughout the entire area of the active area AAR. Accordingly, it is possible to suppress or prevent the connection wires CW from being recognized in the active area AAR.

Each of the constant-voltage wires DM may apply a constant voltage. The constant voltage may be at least one of the first supply voltage VDDL (see FIG. 5) and the second supply voltage VSSL (see FIG. 5). In some other embodiments, the constant-voltage wires DM may apply different constant voltages to different areas. In this instance, two areas to which different constant voltages are applied may be electrically insulated from each other.

The display device 1 may include a first sub-data line DL1_1 and a second sub-data line DL2_1 extending in the first direction DR1 in the first outer active area AAR_L1 on the plane of the substrate 100. The first sub-data line DL1_1 and the second sub-data line DL2_1 have the same function as the first data lines DL1 and the second data lines DL2, respectively, and may be located on the same layer; and, therefore, the redundant descriptions will be omitted.

In the display device 1 according to the embodiment, the data lines DL in the outer active area AAR_L are connected to the wire pads PD via connection wires CW and a connection portion between the main region MR and the bending region BR may have an L-shape. In this manner, the width of the bezel can be reduced.

Figure 11:
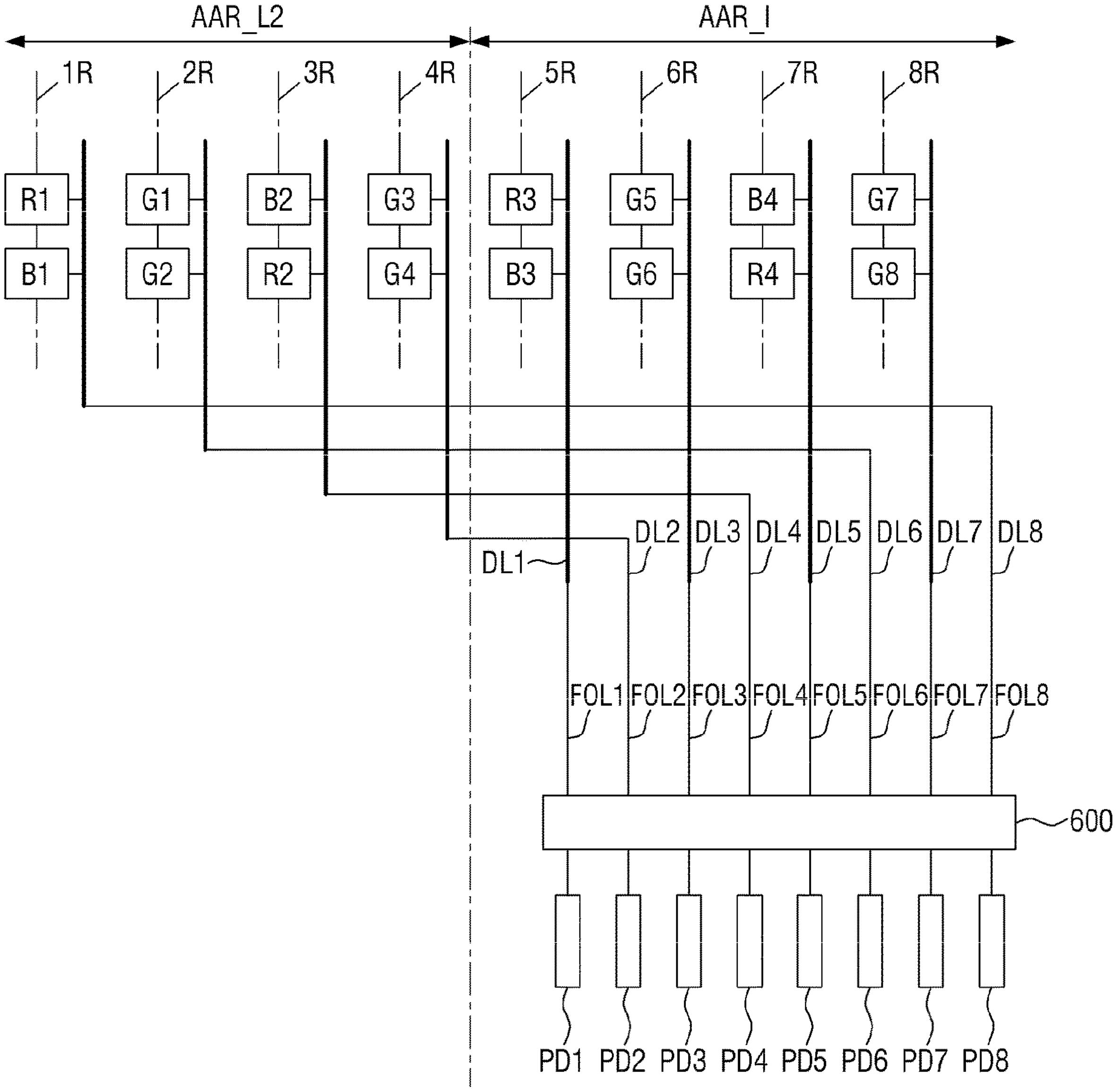
FIG. 11 is a view conceptually showing the structure of the display panel according to an embodiment of the disclosure.

FIG. 11 is a view conceptually showing the structure of the display panel according to an embodiment of the disclosure.

Referring to FIG. 11, the sub-pixels R, G and B of the display panel 10 may have a PenTile matrix. The pixels PX of the display panel 10 may include groups that are repeated in the first direction DR1 and the second direction DR2.

In FIG. 11, only some of the pixels PX disposed in the inner active area AAR_I and the second outer active area AAR_L2 of the display device 1, and only the first to eighth data lines DL1 to DL8 connected to the sub-pixels are shown for the sake of clarity.

The pixels PX may include red sub-pixels R emitting red light, blue sub-pixels B emitting blue light, and green sub-pixels G emitting green light. The red sub-pixels R and the blue sub-pixels B may be alternately arranged in the same column, while the green sub-pixels G may be arranged in a column adjacent to the column in which the red sub-pixels R and the blue sub-pixels B are arranged. In this instance, the red sub-pixels R are arranged in a diagonal direction and the blue sub-pixels B are arranged in a diagonal direction with respect to the column in which the green sub-pixels G are arranged, so that they are arranged in a checkerboard pattern. In other words, the red sub-pixels R and the blue sub-pixels B may be arranged alternately so that they are not disposed in the same column in two adjacent rows.

Specifically, the sub-pixels may be disposed in each of the first row 1R to the eighth row R8. First red sub-pixels R1 and first blue sub-pixels B1 may be disposed in a first row 1R.

First green sub-pixels G1 and second green sub-pixels G2 may be disposed in a second row 2R. Second blue sub-pixels B2 and second red sub-pixels R2 may be disposed in a third row 3R. Third green sub-pixels G3 and fourth green sub-pixels G4 may be disposed in a fourth row 4R. Third red sub-pixels R3 and third blue sub-pixels B3 may be disposed in a fifth row 5R. Fifth green sub-pixels G5 and sixth green sub-pixels G6 may be disposed in a sixth row 6R. Fourth blue sub-pixels B4 and fourth red sub-pixels R4 may be disposed in a seventh row 7R. Seventh green sub-pixels G7 and eighth green sub-pixels G8 may be disposed in an eighth row 8R. The data lines DL may be disposed in each of the rows.

The plurality of sub-pixels R, G and B in the inner active area AAR_I may be connected to respective data lines among the data lines DL. For example, the third red sub-pixel R3 and the third blue sub-pixel B3 may be connected to the first data line DL1, the fifth green sub-pixel G5 and the sixth green sub-pixel G6 may be connected to the third data line DL3, the fourth blue sub-pixel B4 and the fourth red sub-pixel R4 may be connected to the fifth data line DL5, and the seventh green sub-pixel G7 and the eighth green sub-pixel G8 may be connected to the seventh data line DL7.

In addition, the plurality of sub-pixels R, G and B in the second outer active area AAR_L2 may be connected to respective data lines among the data lines DL. For example, the third green sub-pixels G3 and the fourth green sub-pixels G4 may be connected to the second data line DL2, the second red sub-pixels R2 and the second blue sub-pixels B2 may be connected to the fourth data line DL4, the first green sub-pixels G1 and the second green sub-pixels G2 may be connected to the sixth data line DL6, and the first blue sub-pixels B1 and the first red sub-pixels R1 may be connected to the eighth data line DL8.

Figure 12:
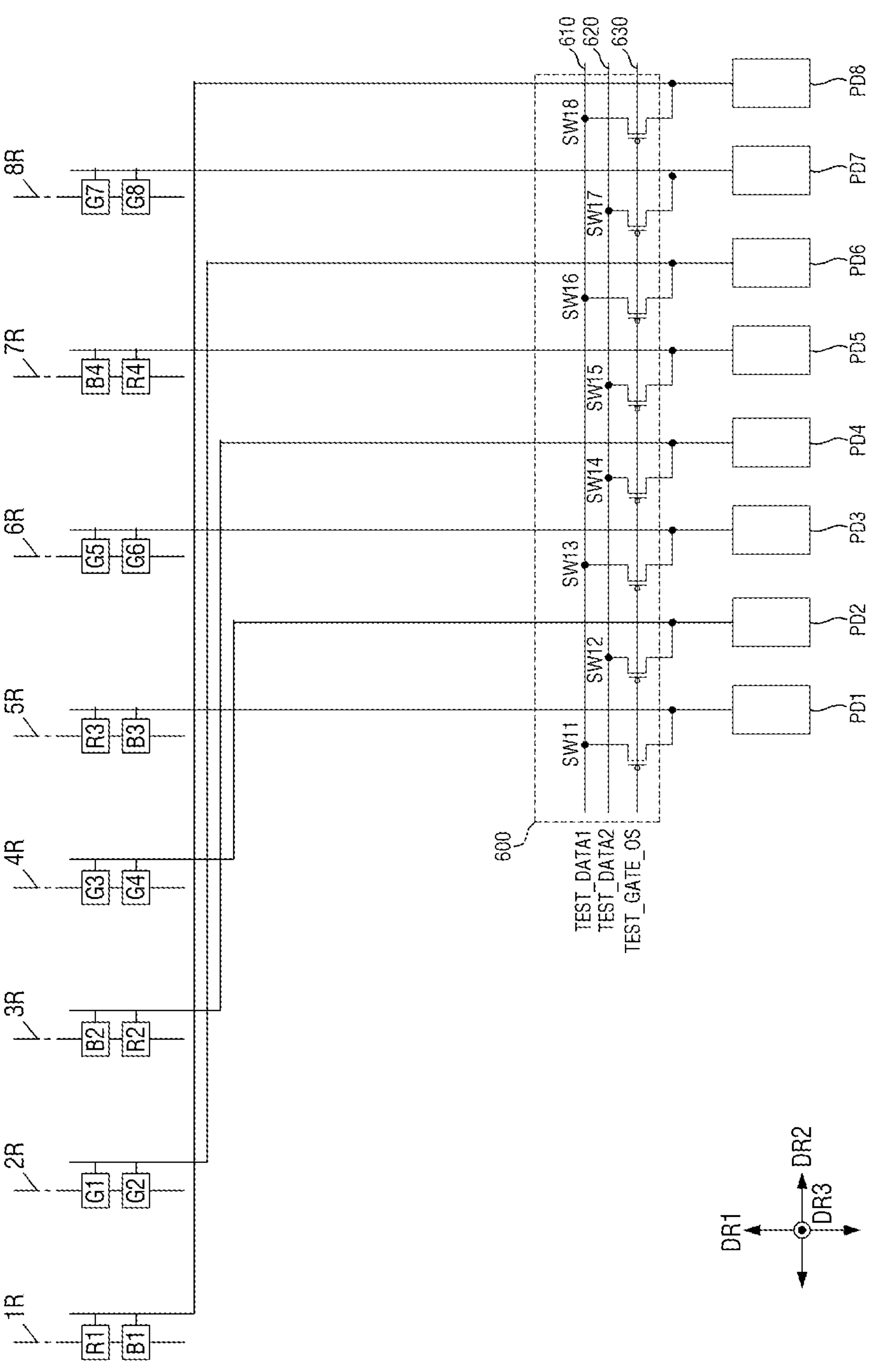
FIG. 12 is a diagram illustrating a circuit configuration of a display device according to an embodiment.
Figure 13:
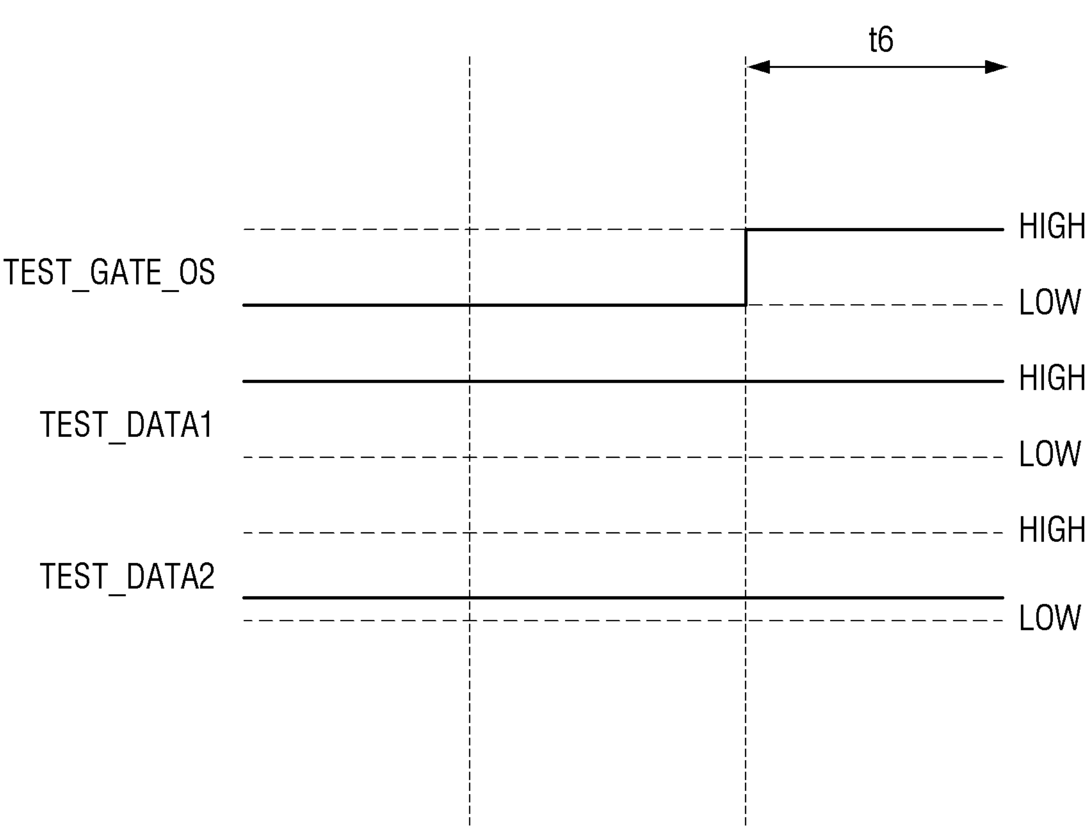
FIG. 13 is a timing diagram illustrating a fan-out line test in a display device according to an embodiment.
Figure 14:
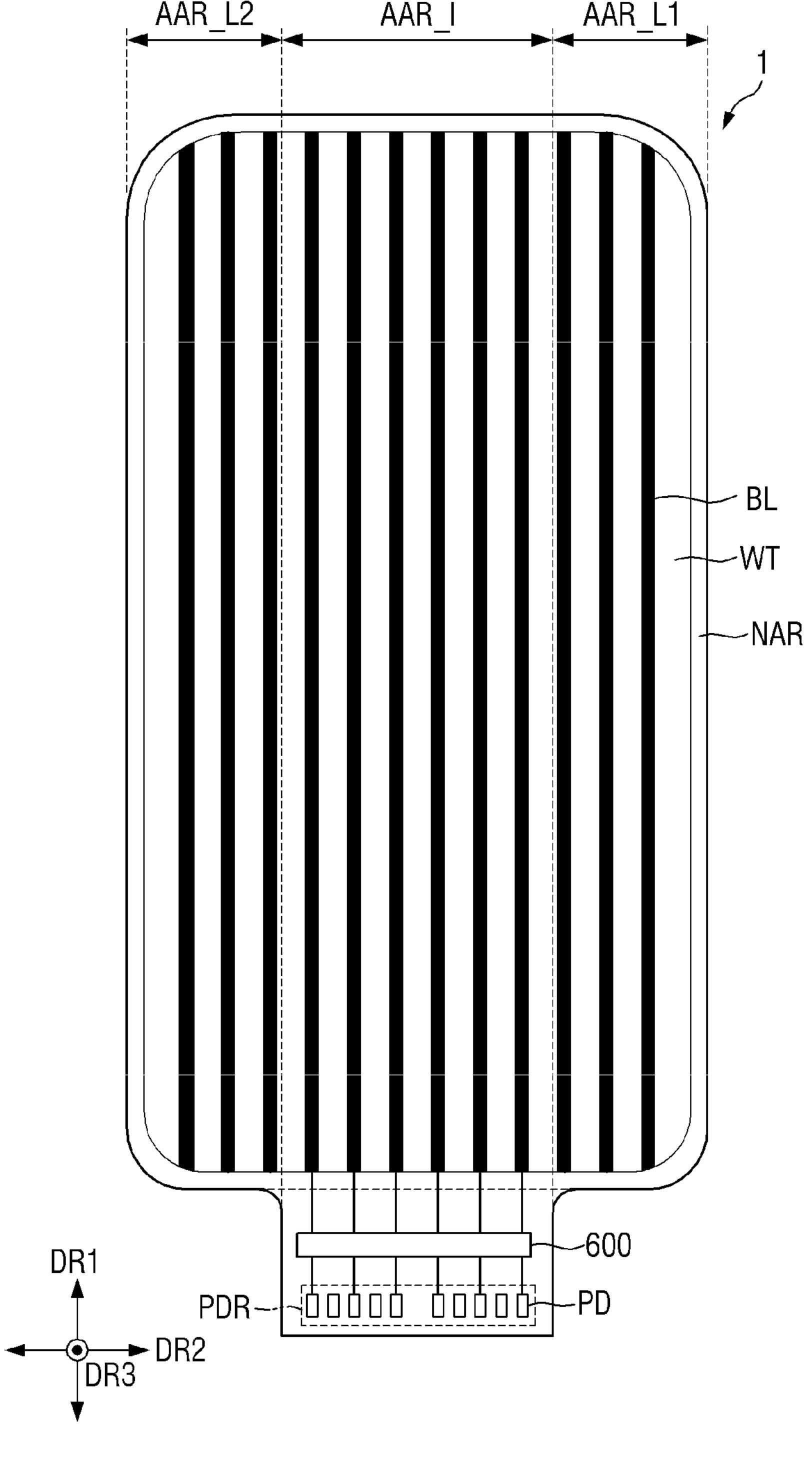
FIG. 14 is a view for conceptually showing a result of a fan-out line test displayed on a display panel according to an embodiment.

FIG. 12 is a diagram illustrating a circuit configuration of a display device according to an embodiment. FIG. 13 is a timing diagram illustrating a fan-out line test in a display device according to an embodiment. FIG. 14 is a view for conceptually showing a result of a fan-out line test displayed on a display panel according to an embodiment.

Referring to FIG. 12, the display device 1 may include a test unit 600 disposed between the pixels PX and the wire pads DP.

As described above, the data lines DL include the first data line DL1 to the eighth data line. The odd-numbered data lines DL1, DL3, DL5 and DL7 are connected to the sub-pixels R, G and B in the inner active area AAR_I. The even-numbered data lines DL2, DL4, DL6 and DL8 are connected to the sub-pixels R, G and B in the second outer active are AAR_L2.

Specifically, in the second outer active area AAR_L2, the pixels in the first row 1R are connected to the second data line DL2, the pixels in the second row 2R are connected to the fourth data line DL4, the pixels in the third row 3R are connected to the sixth data line DL6, and the pixels in the fourth row 4R are connected to the eighth data line DL8.

In addition, in the inner active area AAR_I, the pixels in the fifth row 5R are connected to the first data line DL1, the pixels in the sixth row 6R are connected to the third data line DL3, the pixels in the seventh row 7R are connected to the fifth data line DL5, and the pixels in the eighth row 8R are connected to the seventh data line DL7.

The wire pads DP are located where the display driver circuit 20 is disposed as shown in FIG. 2. The wire pads DP may include first to eighth wire pads DP1 to DP8, for example.

The first to eighth fan-out lines FOL1 to FOL8 may connect the first to eighth data lines DL1 to DL8 to the first to eighth wiring pads DP1 to DP8, respectively. For example, the first fan-out line FOL1 may connect the first wire pad PD1 with the first data line DL1, the second fan-out line FOL2 may connect the second wire pad PD2 with the second data line DL2, the third fan-out line FOL3 may connect the third wire pad PD3 with the third data line DL3, the fourth fan-out line FOL4 may connect the fourth wire pad PD4 with the fourth data line DL4, the fifth fan-out line FOL5 may connect the fifth wire pad PD5 with the fifth data line DL5, the sixth fan-out line FOL6 may connect the sixth wire pad PD6 with the sixth data line DL6, the seventh fan-out line FOL7 may connect the seventh wire pad PD7 with the seventh data line DL7, and the eighth fan-out line FOL8 may connect the eighth wire pad PD8 with the eighth data line DL8.

The first to eighth fan-out lines FOL1 to FOL8 may extend in the first direction DR1 and may be spaced apart from each other in the second direction DR2. In addition, the odd-numbered fan-out lines FOL1, FOL3, FOL5 and FOL7 and the even-numbered fan-out lines FOL2, FOL4, FOL6 and FOL8 may be disposed on different layers with at least one insulating film interposed therebetween. For example, the odd-numbered fan-out lines FOL1, FOL3, FOL5 and FOL7 may be arranged adjacent to the lower layer, and at least one insulating film may be formed on the odd-numbered fan-out lines FOL1, FOL3, FOL5 and FOL7. Then, the even-numbered fan-out lines FOL2, FOL4, FOL6 and FOL8 may be arranged on the at least one insulating film. In this instance, the even-numbered fan-out lines FOL2, FOL4, FOL6 and FOL8 may be arranged between the odd-numbered fan-out lines FOL1, FOL3, FOL5 and FOL7, respectively.

As described above, the test unit 600 may be disposed between the first to eighth wire pads DP1 to DP8 to which the display drive circuit 20 is connected and the first to eighth data lines DL1 to DL8.

The test unit 600 may include a first control line 610, a second control line 620, a test voltage line 630, and switches. The test unit 600 may be disposed adjacent to one side of the wire pads PD between the wire pads PD and the fan-out lines FOL, to easily determine a disconnection of any of the fan-out lines FOL connected to the data lines DL.

The first control line 610, the second control line 620 and the test voltage line 630 may extend in the second direction DR2 and may be spaced apart from one another in the first direction DR1.

The switches of the test unit 600 may include a first switch SW11 connected to the first fan-out line FOL1, a second switch SW12 connected to the second fan-out line FOL2, a third switch SW13 connected to the third fan-out line FOL3, a fourth switch SW14 connected to the fourth fan-out line FOL4, a fifth switch SW15 connected to the fifth fan-out line FOL5, a sixth switch SW16 connected to the sixth fan-out line FOL6, a seventh switch SW17 connected to the seventh fan-out line FOL7, and an eighth switch SW18 connected to the eighth fan-out line FOL8.

Specifically, a gate terminal of the first switch SW11 is connected to the test voltage line 630 that supplies a test control signal TEST_GATE_OS. The first terminal of the first switch SW11 may be connected to the first fan-out line FOL1, and the second terminal thereof may be connected to the first control line 610 that supplies the first test data signal TEST_DATA1. In this instance, the first test data signal TEST_DATA1 may have the first data. The first data voltage may have a value corresponding to greater than 0 grayscale level, for example, 255 grayscale level. The first switch SW11 may be turned on by the test control signal TEST_GATE_OS to connect the first control line 610 with the first fan-out line FOL1.

The gate terminal of the second switch SW12 is connected to the test voltage line 630 that supplies the test control signal TEST_GATE_OS. The first terminal of the second switch SW12 may be connected to the second fan-out line FOL2, and the second terminal thereof may be connected to the second control line 620 that supplies the second test data signal TEST_DATA2. In this instance, the second test data signal TEST_DATA2 may have the second data. The second data voltage may have, for example, a value corresponding to 0 grayscale level. The second switch SW12 may be turned on by the test control signal TEST_GATE_OS to connect the second control line 620 with the second fan-out line FOL2.

The gate terminal of the third switch SW13 is connected to the test voltage line 630 that supplies the test control signal TEST_GATE_OS. The first terminal of the third switch SW13 may be connected to the third fan-out line FOL3, and the second terminal thereof may be connected to the first control line 610 that supplies the first test data signal TEST_DATA1. In this instance, the first test data signal TEST_DATA1 may have the first data. The first data voltage may have, for example, a value corresponding to greater than 0 grayscale level, for example, 255 grayscale level. The third switch SW13 may be turned on by the test control signal TEST_GATE_OS to connect the first control line 610 with the third fan-out line FOL3.

The gate terminal of the fourth switch SW14 is connected to the test voltage line 630 that supplies the test control signal TEST_GATE_OS. The first terminal of the fourth switch SW14 may be connected to the fourth fan-out line FOL4, and the second terminal thereof may be connected to the second control line 620 that supplies the second test data signal TEST_DATA2. In this instance, the second test data signal TEST_DATA2 may have the second data. The second data voltage may have, for example, a value corresponding to 0 grayscale level. The fourth switch SW14 may be turned on by the test control signal TEST_GATE_OS to connect the second control line 620 with the fourth fan-out line FOL4.

The gate terminal of the fifth switch SW15 is connected to the test voltage line 630 that supplies the test control signal TEST_GATE_OS. The first terminal of the fifth switch SW15 may be connected to the fifth fan-out line FOL5, and the second terminal thereof may be connected to the second control line 620 that supplies the second test data signal TEST_DATA2. In this instance, the second test data signal TEST_DATA2 may have the second data. The second data voltage may have, for example, a value corresponding to 0 grayscale level. The fifth switch SW15 may be turned on by the test control signal TEST_GATE_OS to connect the second control line 620 with the fifth fan-out line FOL5.

The gate terminal of the sixth switch SW16 is connected to the test voltage line 630 that supplies the test control signal TEST_GATE_OS. The first terminal of the sixth switch SW16 may be connected to the sixth fan-out line FOL6, and the second terminal thereof may be connected to the first control line 610 that supplies the first test data signal TEST_DATA1. In this instance, the first test data signal TEST_DATA1 may have the first data. The first data voltage may have, for example, a value corresponding to greater than 0 grayscale level, for example, 255 grayscale level. The sixth switch SW16 may be turned on by the test control signal TEST_GATE_OS to connect the first control line 610 with the sixth fan-out line FOL6.

The gate terminal of the seventh switch SW17 is connected to the test voltage line 630 that supplies the test control signal TEST_GATE_OS. The first terminal of the seventh switch SW17 may be connected to the seventh fan-out line FOL7, and the second terminal thereof may be connected to the second control line 620 that supplies the second test data signal TEST_DATA2. In this instance, the second test data signal TEST_DATA2 may have the second data. The second data voltage may have, for example, a value corresponding to 0 grayscale level. The seventh switch SW17 may be turned on by the test control signal TEST_GATE_OS to connect the second control line 620 with the fifth fan-out line FOL5.

The gate terminal of the eighth switch SW18 is connected to the test voltage line 630 that supplies the test control signal TEST_GATE_OS. The first terminal of the eighth switch SW18 may be connected to the eighth fan-out line FOL8, and the second terminal thereof may be connected to the first control line 610 that supplies the first test data signal TEST_DATA1. In this instance, the first test data signal TEST_DATA1 may have the first data. The first data voltage may have, for example, a value corresponding to greater than 0 grayscale level, for example, 255 grayscale level. The eighth switch SW18 may be turned on by the test control signal TEST_GATE_OS to connect the first control line 610 with the eighth fan-out line FOL8. The first to eighth switches SW11 to SW18 may be implemented as transistors. In this instance, the gate terminal, the first terminal and the second terminal of each of the first to eighth switches SW11 to SW18 may correspond to the gate electrode, the first electrode and the second electrode of a transistor, respectively. The first electrode and the second electrode may be a source electrode and a drain electrode, or a drain electrode or a source electrode.

The test unit 600 according to the embodiment of the disclosure may connect the first control line 610 for supplying the first test data signal TEST_DATA1 and the second control line 620 for supplying the second test data signal TEST_DATA2 with the fan-out lines FOL, so that a voltage having a value corresponding to one of 0 to 255 grayscale levels may be applied to each pixel PX. Specifically, for the display panel 10 having the inner active area AAR_I and the outer active area AAR_L (AAR_L1 and AAR_L2), when a black or white voltage is sequentially applied to the sub-pixels of the first row 1R to the eighth row 8R, the sub-pixels of the first row 1R and the second row 2R may display a pixel value corresponding to greater than 0 grayscale level, for example, 255 grayscale level as a single pixel PX.

Referring to FIGS. 12 to 14, the test of the fan-out lines FOL will be described.

The test unit 600 may be activated while the fan-out lines FOL are tested. The test unit 600 may have a first activation period t6 in which the high-level control signal TEST_GATE_OS is applied to the test voltage line 630. For example, during the first activation period t6, the high-level test control signal TEST_GATE_OS may be applied to the gate terminals of the first to eighth switches SW11 to SW18. Accordingly, each of the first to eighth switches SW11 to SW18 may be turned on so that the first terminal may be electrically connected to the second terminal.

That is to say, the first fan-out line FOL1, the third fan-out line FOL3, the sixth fan-out line FOL6 and the eighth fan-out line FOL8 may be connected to the first control line 610. The first switch SW11 may apply the high-level first test data signal TEST_DATA1 of the first control line 610 to the first fan-out line FOL1. In addition, the third switch SW13 may apply the high-level first test data signal TES- T_DATA1 of the first control line 610 to the third fan-out line FOL3. In addition, the sixth switch SW16 may apply the high-level first test data signal TEST_DATA1 of the first control line 610 to the sixth fan-out line FOL6. In addition, the eighth switch SW18 may apply the high-level first test data signal TEST_DATA1 of the first control line 610 to the eighth fan-out line FOL8.

In addition, the second fan-out line FOL2, the fourth fan-out line FOL4, the fifth fan-out line FOL5 and the seventh fan-out line FOL7 may be connected to the second control line 620. The second switch SW12 may apply the low-level second test data signal TEST_DATA2 of the second control line 620 to the second fan-out line FOL2. In addition, the fourth switch SW14 may apply the low-level second test data signal TEST_DATA2 of the second control line 620 to the fourth fan-out line FOL4. In addition, the fifth switch SW15 may apply the low-level second test data signal TEST_DATA2 of the second control line 620 to the fifth fan-out line FOL5. In addition, the seventh switch SW17 may apply the low-level second test data signal TEST_DATA2 of the second control line 620 to the seventh fan-out line FOL7.

Accordingly, the high-level first test data signal TEST_DATA1 is applied to the first fan-out line FOL1, the third fan-out line FOL3, the sixth fan-out line FOL6 and the eighth fan-out line FOL8. The first data voltage may be applied to the sub-pixels of the first row 1R, the second row 2R, the fifth row 5R and the sixth row 6R. In addition, the low-level second test data signal TEST_DATA2 is applied to the second fan-out line FOL2, the fourth fan-out line FOL4, the fifth fan-out line FOL5 and the seventh fan-out line FOL7. The second data voltage may be applied to the sub-pixels of the third row 3R, the fourth row 4R, the seventh row 7R and the eighth row 8R.

Referring to FIG. 14, the sub-pixels in the first column 1R and the second column 2R, the sub-pixels in the third column 3R and the fourth column 4R, the sub-pixels in the fifth column 5R and the sixth column 6R, and the sub-pixels in the seventh column 7R and the eighth column 8R form respective pixels PX. The pixels PX may alternately emit lights. In this instance, the pixel PX that receives the first data voltage according to the first test data signal TEST_DATA1 emits light having a value corresponding to one of 1 to 255 grayscale levels. In addition, the pixel PX that receives the second data voltage according to the second test data signal TEST_DATA2 emits light having the value corresponding to 0 grayscale level. That is to say, for the display panel 10 having the inner active area AAR_I and the outer active area AAR_L (AAR_L1 and AAR_L2), each of the pixels PX formed by the sub-pixels of the first row 1R to the eighth row 8R sequentially displays black or white. The pixels PX may display a repetitive black-white pattern on the display panel 10 as shown in FIG. 14.

If there is an open-circuit in the fan-out lines FOL, an irregular pattern other than the black-white pattern is displayed. Accordingly, it can be easily determined that there is an open-circuit in the fan-out lines FOL. For example, if there is an open-circuit in the first fan-out line FOL1, the first data voltage may not be applied to the sub-pixels of the fifth row 5R even when the first data voltage is applied to the first fan-out line FOL1. Accordingly, a single pixel PX formed by the sub-pixels of the fifth row 5R and the sixth tow 6R may emit green light instead of a white light. Accordingly, as such an irregular pattern is displayed on the display panel 10, the test unit 600 can easily determine that there is a defect in the fan-out lines FOL.

If there is a short-circuit in the fan-out lines FOL, an irregular pattern other than the black-white pattern is displayed. Accordingly, it can be easily determined that there is a short-circuit in the fan-out lines FOL. That is to say, it is possible to determine whether there is a defect in the fan-out lines FOL based on a color of the pixels PX connected to the fan-out lines FOL where a short-circuit has been created. For example, if there is a short-circuit between the first fan-out line FO1 and the second fan-out line FOL2, the first data voltage applied to the first fan-out line FO1 and the second data voltage applied to the second fan-out line FOL2 may affect each other. Accordingly, a value between the first data voltage and the second data voltage may be applied to the first fan-out line FOL1. As a result, the sub-pixels of the fifth row 5R connected to the first fan-out line FOL1 may emit light with a grayscale level different from the grayscale level according to the first data voltage. In addition, a value between the first data voltage and the second data voltage may be applied to the second fan-out line FOL2. The sub-pixels of the fourth row 4R connected to the second fan-out line FO2 may emit light with a grayscale level different from the grayscale level according to the second data voltage. Accordingly, as such an irregular pattern is displayed on the display panel 10, the test unit 600 can easily determine that there is a defect in the fan-out lines FOL.

Figure 15:
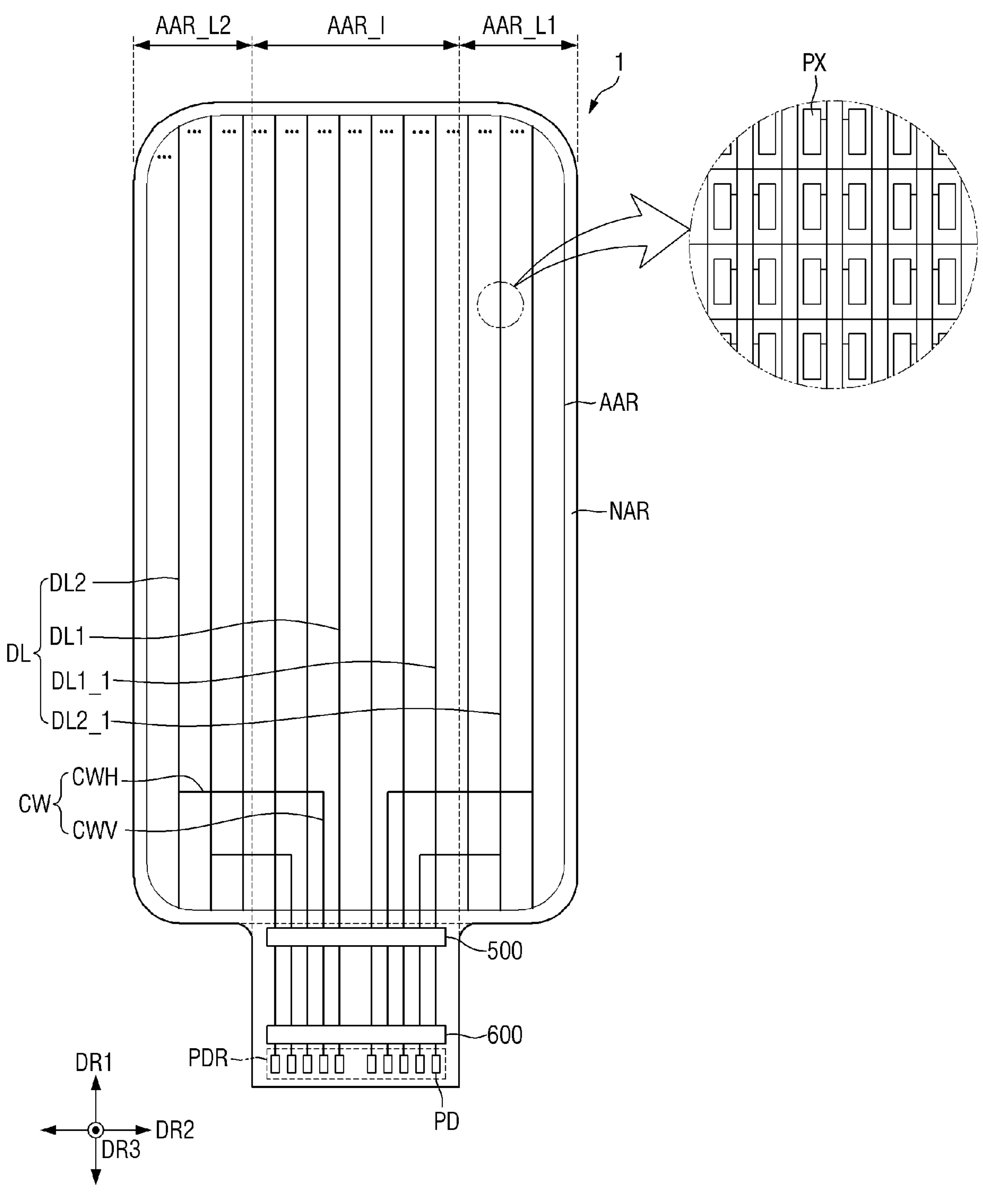
FIG. 15 is a plan view showing a display device according to another embodiment of the disclosure.
Figure 16:
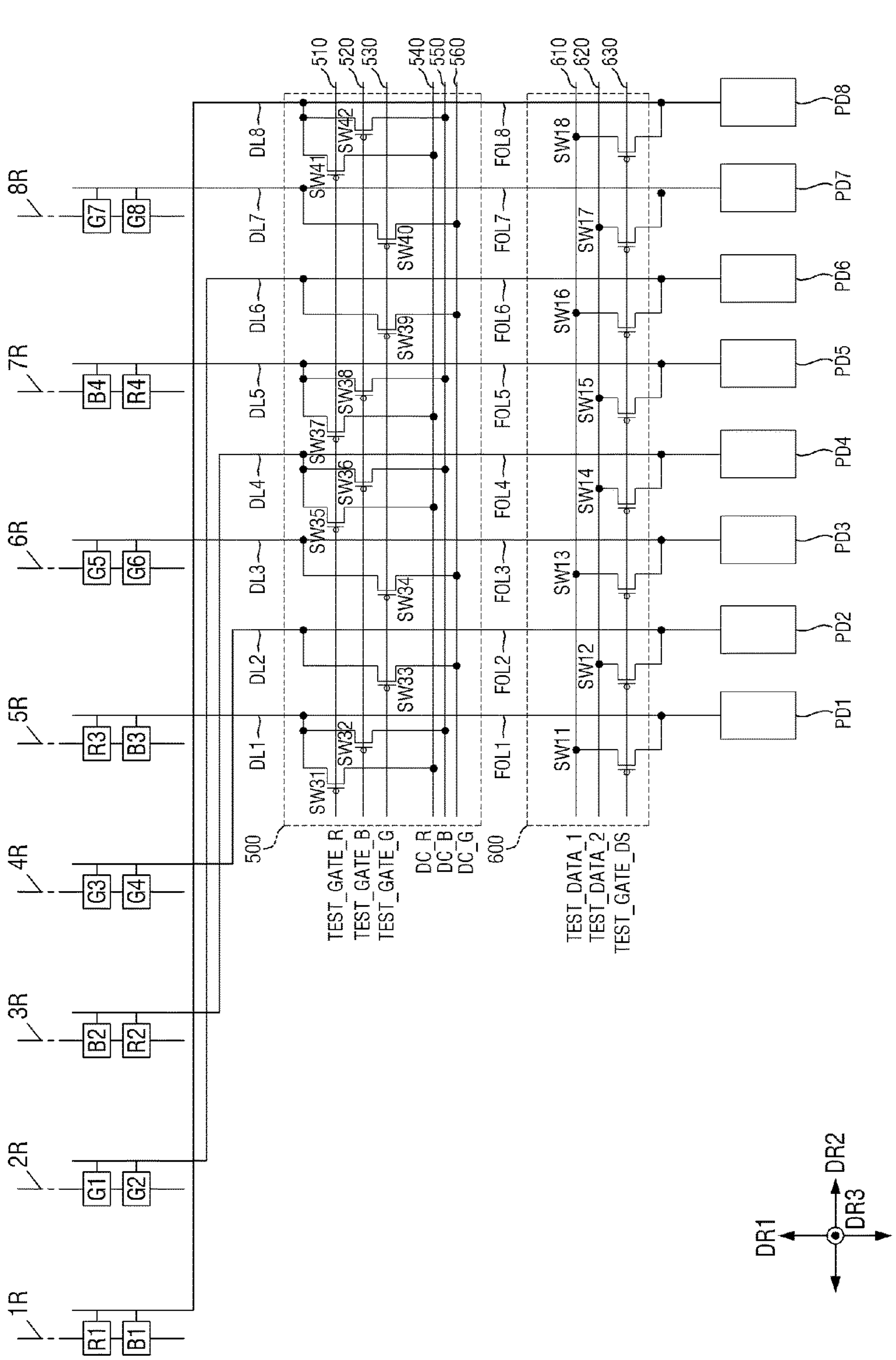
FIG. 16 is a view showing a circuit configuration of the display device according to another embodiment of the disclosure.
Figure 17:
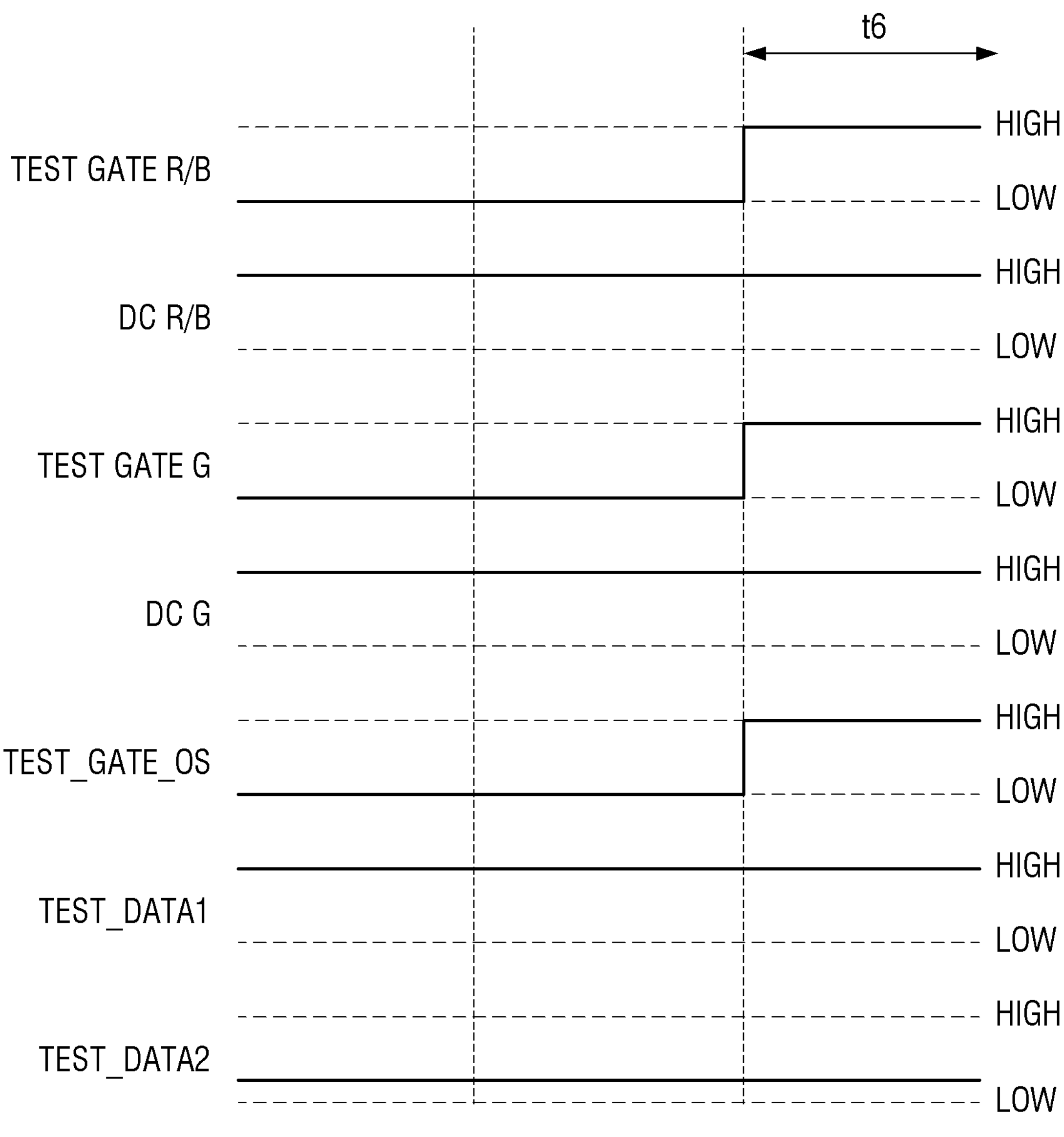
FIG. 17 is a timing diagram illustrating a fan-out line test in a display device according to another embodiment.

FIG. 15 is a plan view showing a display device according to another embodiment of the disclosure. FIG. 16 is a view showing a circuit configuration of the display device according to another embodiment of the disclosure. FIG. 17 is a timing diagram illustrating a fan-out line test in a display device according to another embodiment.

The embodiment of FIGS. 15 to 17 is substantially identical to the embodiment of FIGS. 11 to 14 except that a lighting circuit 500 is added; and, therefore, the redundant descriptions will be omitted. Referring to FIG. 15, the display device 1 may include a test unit 600 and a lighting circuit 500 disposed between pixels PX and the wire pads DP. That is to say, the lighting circuit 500 may be disposed between the pixels PX and the test unit 600. The lighting circuit 500 may check if any of the pixels is defective between data lines DL and a display driver circuit 20.

As described above, the data lines DL connected to the lighting circuit 500 include the first data line DL1 to the eighth data line. DL8 The odd-numbered data lines DL1, DL3, DL5 and DL7 are connected to the sub-pixels R, G and B in the inner active area AAR_I. The even-numbered data lines DL2, DL4, DL6 and DL8 are connected to the sub-pixels R, G and B in the second outer active are AAR_L2.

Referring to FIG. 16, the lighting circuit 500 may include a plurality of control lines 510, 520 and 530, a plurality of lighting test signal lines 540, 550 and 560, and switches. The lighting circuit 500 may be disposed adjacent to one side of the data lines DL between the fan-out lines FOL and the data lines DL and may check if each of the pixels PX connected to the data lines DL is turned on.

The lighting circuit 500 may include a first lighting control line 510, a second lighting control line 520, a seventh control line 530, a first lighting test signal line 540, a second lighting test signal line 550, a third lighting test signal line 560 and switches. The first lighting control line 510, the second lighting control line 520, the third lighting control line 530, the first lighting test signal line 540, the second lighting test signal line 550 and the third lighting test signal line 560 may extend in the second direction DR2 and may be spaced apart from one another other in the first direction DR1.

The switches of the lighting circuit 500 may include a thirteenth switch SW31 and a fourteenth switch SW32 connected to the first data line DL1; a fifteenth switch SW33 connected to the second data line DL2; a sixteenth switch SW34 connected to the third data line DL3; a seventeenth switch SW35 and an eighteenth switch SW36 connected to the fourth data line DL4; a nineteenth switch SW37 and a twentieth switch SW38 connected to the fifth data line DL5; a twenty-first switch SW39 connected to the sixth data line DL6; a twenty-second switch SW40 connected to the seventh data line DL7; and a twenty-third switch SW41 and a twenty-fourth switch SW42 connected to the eighth data line DL8.

Specifically, the gate terminal of the thirteenth switch SW31 is connected to the first lighting control line 510 that supplies a first lighting test control signal TEST_GATE_R. The first terminal of the thirteenth switch SW31 may be connected to the first lighting test signal line 540 that supplies the first lighting test signal DC_R, and the second terminal thereof may be connected to the first data line DL1. The thirteenth switch SW31 may be turned on by the first lighting test control signal TEST_GATE_R to connect the first lighting test signal line 540 with the first data line DL1.

The gate terminal of the fourteenth switch SW32 is connected to the second lighting control line 520 that supplies a second lighting test control signal TEST_GATE_B. The first terminal of the fourteenth switch SW32 may be connected to the second lighting test signal line 550 that supplies a second lighting test signal DC_B, and the second terminal thereof may be connected to the first data line DL1. The fourteenth switch SW32 may be turned on by the second lighting test control signal TEST_GATE_B to connect the second lighting test signal line 550 with the first data line DL1.

The gate terminal of the fifteenth switch SW33 is connected to the third lighting control line 530 that supplies a third lighting test control signal TEST_GATE_G. The first terminal of the fifteenth switch SW33 may be connected to the third lighting test signal line 560 that supplies a third lighting test signal DC_G, and the second terminal thereof may be connected to the second data line DL2. The fifteenth switch SW33 may be turned on by the third lighting test control signal TEST_GATE_G to connect the third lighting test signal line 560 with the second data line DL2.

The gate terminal of the sixteenth switch SW34 is connected to the third lighting control line 530 that supplies the third lighting test control signal TEST_GATE_G. The first terminal of the sixteenth switch SW34 may be connected to the third lighting test signal line 560 that supplies the third lighting test signal DC_G, and the second terminal thereof may be connected to the third data line DL3. The sixteenth switch SW34 may be turned on by the third lighting test control signal TEST_GATE_G to connect the third lighting test signal line 560 with the third data line DL3.

The gate terminal of the seventeenth switch SW35 is connected to the first lighting control line 510 that supplies the first lighting test control signal TEST_GATE_R. The first terminal of the seventeenth switch SW35 may be connected to the first lighting test signal line 540 that supplies the first lighting test signal DC_R, and the second terminal thereof may be connected to the fourth data line DL4. The seventeenth switch SW35 may be turned on by the first lighting test control signal TEST_GATE_R to connect the first lighting test signal line 540 with the fourth data line DL4.

The gate terminal of the eighteenth switch SW36 is connected to the second lighting control line 520 that supplies the second lighting test control signal TEST_GATE_B. The first terminal of the eighteenth switch SW36 may be connected to the second lighting test signal line 550 that supplies the second lighting test signal DC_B, and the second terminal thereof may be connected to the fourth data line DL4. The eighteenth switch SW36 may be turned on by the second lighting test control signal TEST_GATE_B to connect the second lighting test signal line 550 with the fourth data line DL4.

The gate terminal of the nineteenth switch SW37 is connected to the first lighting control line 510 that supplies the first lighting test control signal TEST_GATE_R. The first terminal of the nineteenth switch SW37 may be connected to the first lighting test signal line 540 that supplies the first lighting test signal DC_R, and the second terminal thereof may be connected to the fifth data line DL5. The nineteenth switch SW37 may be turned on by the first lighting test control signal TEST_GATE_R to connect the first lighting test signal line 540 with the fifth data line DL5.

The gate terminal of the twentieth switch SW38 is connected to the second lighting control line 520 that supplies the second lighting test control signal TEST_GATE_B. The first terminal of the twentieth switch SW38 may be connected to the second lighting test signal line 550 that supplies the second lighting test signal DC_B, and the second terminal thereof may be connected to the fifth data line DL5. The twentieth switch SW38 may be turned on by the second lighting test control signal TEST_GATE_B to connect the second lighting test signal line 550 with the fifth data line DL5.

The gate terminal of the twenty-first switch SW39 is connected to the third lighting control line 530 that supplies the third lighting test control signal TEST_GATE_G. The first terminal of the twenty-first switch SW39 may be connected to the third lighting test signal line 560 that supplies the third lighting test signal DC_G, and the second terminal thereof may be connected to the sixth data line DL6. The twenty-first switch SW39 may be turned on by the third lighting test control signal TEST_GATE_G to connect the third lighting test signal line 560 with the sixth data line DL6.

The gate terminal of the twenty-second switch SW40 is connected to the third lighting control line 530 that supplies the third lighting test control signal TEST_GATE_G. The first terminal of the twenty-second switch SW40 may be connected to the third lighting test signal line 560 that supplies the third lighting test signal DC_G, and the second terminal thereof may be connected to the seventh data line DL7. The twenty-second switch SW40 may be turned on by the third lighting test control signal TEST_GATE_G to connect the third lighting test signal line 560 with the seventh data line DL7.

The gate terminal of the twenty-third switch SW41 is connected to the first lighting control line 510 that supplies the first lighting test control signal TEST_GATE_R. The first terminal of the twenty-third switch SW41 may be connected to the first lighting test signal line 540 that supplies the first lighting test signal DC_R, and the second terminal thereof may be connected to the eighth data line DL8. The twenty-third switch SW41 may be turned on by the first lighting test control signal TEST_GATE_R to connect the first lighting test signal line 540 with the eighth data line DL8.

The gate terminal of the twenty-fourth switch SW42 is connected to the second lighting control line 520 that supplies the second lighting test control signal TEST_GATE_B. The first terminal of the twenty-fourth switch SW42 may be connected to the second lighting test signal line 550 that supplies the second lighting test signal DC_B, and the second terminal thereof may be connected to the eighth data line DL8. The twenty-fourth switch SW42 may be turned on by the second lighting test control signal TEST_GATE_B to connect the second lighting test signal line 550 with the eighth data line DL8.

It will be understood that, although the terms first, second, etc. may be used herein to describe various elements, these elements should not be limited by these terms. These terms are used to merely distinguish one element from another. For example, a first element could be termed a second element, and, similarly, a second element could be termed a first element, without departing from the scope of the inventive subject matter. The thirteenth to twenty-fourth switches SW31 to SW42 may be implemented as transistors. In this instance, the gate terminal, the first terminal and the second terminal of each of the thirteenth to twenty-fourth switches SW31 to SW42 may correspond to the gate electrode, the first electrode and the second electrode of a transistor, respectively. The first electrode and the second electrode may be a source electrode and a drain electrode, or a drain electrode or a source electrode. Referring further to FIG. 17, high-level lighting test control signals TEST_GATE_R/G/B and the lighting test signals DC_R/G/B may be applied to the lighting circuit 500.

The lighting circuit 500 may check if a red sub-pixel is turned on in a second activation period t6 through the first lighting test control signal TEST_GATE_R and the first lighting test signal DC_R. Specifically, when the first lighting test control signal TEST_GATE_R and the first lighting test signal DC_R of high level are applied in the second activation period t6, the first red sub-pixels R1, the second red sub-pixels R2, the third red sub-pixels R3 and the fourth red sub-pixels R4 may emit lights. Accordingly, it is possible to determine if there is an open-circuit in the lines connected to the red sub-pixels.

The lighting circuit 500 may check if the blue sub-pixels are turned on through the second lighting test control signal TEST_GATE_B and the second lighting test signal DC_B. Specifically, when the second lighting test control signal TEST_GATE_B and the second lighting test signal DC_B of high level are applied, the first blue sub-pixels B1, the second blue sub-pixels B2, the third blue sub-pixels B3 and the fourth blue sub-pixels B4 may emit lights. Accordingly, it is possible to determine if there is an open-circuit in the lines connected to the blue sub-pixels.

The lighting circuit 500 may check if the green sub-pixels are turned on through the third lighting test control signal TEST_GATE_G and the third lighting test signal DC_G. Specifically, when the third lighting test control signal TEST_GATE_G and the third lighting test signal DC_G of high level are applied, the first green sub-pixels G1, the second green sub-pixels G2, the third green sub-pixels G3 and the fourth green sub-pixels G4 may emit lights. Accordingly, it is possible to determine if there is an open-circuit in the lines connected to the green sub-pixels.

Also in this embodiment, the test unit 600 applies signals corresponding to the sub-pixels of the first row 1R to the eighth row 8R, such that an irregular pattern is displayed on the display panel 10 even when there is an open-circuit or a short-circuit in the fan-out lines FOL, and it is possible to easily determine if any of the fan-out lines FOL is defective.

In addition, the lighting circuit 500 applies the lighting test control signals TEST_GATE_R/G/B and the lighting test signals DC_R/G/B corresponding to the sub-pixels of the first row 1R to the eighth row 8R, and thus it is possible to easily detect if any of the fan outlines FOL is defective.

In concluding the detailed description, those skilled in the art will appreciate that many variations and modifications can be made to the preferred embodiments without substantially departing from the principles of the present inventive concept. Therefore, the disclosed preferred embodiments of the inventive concept are used in a generic and descriptive sense only and not for purposes of limitation.

What is claimed is:

1. A display device comprising:

a plurality of pixels arranged in a matrix configuration along a plurality of pixel columns and a plurality of pixel rows, each of the plurality of pixels including a plurality of sub-pixels disposed in a display area;

a plurality of data lines extending in a first direction to traverse the display area and connected to the plurality of sub-pixels, respectively;

a plurality of wire pads disposed in a non-display area that is a peripheral area of the display area and disposed on one side of the display area;

a plurality of fan-out lines extending in the first direction and connected to the plurality of wire pads, respectively;

a plurality of connection wires connecting the plurality of fan-out lines to the plurality of data lines, respectively, a first connection wire of at least one of the plurality of connection wires comprising a first portion disposed in the display area and extending in a second direction crossing the first direction; and a test unit disposed between the plurality of wire pads and the display area, and electrically connected to the plurality of fan-out lines, wherein the test unit is configured to apply a test voltage to the plurality of fan-out lines to check a short-circuit or an open-circuit in the plurality of fan-out lines, wherein the first portion of the first connection wire, which extends in the second direction, directly and physically contacts a first data line of the plurality of data lines, which extends in the first direction, in the display area.

2. The display device of claim 1, wherein the plurality of sub-pixels comprises red sub-pixels, green sub-pixels, and blue sub-pixels, the red sub-pixels and the blue sub-pixels are disposed adjacent to one another in the first direction, and the green sub-pixels are arranged in the first direction, and the red sub-pixels and the green sub-pixels are disposed adjacent to one another in the second direction.

3. The display device of claim 2, wherein the plurality of fan-out lines are alternately connected to one of the plurality of connection wires or one of the plurality of data lines.

4. The display device of claim 3, wherein the test unit comprises:

a plurality of switches, each of the plurality of switches including a gate terminal, a first terminal and a second terminal;

a test voltage line for supplying a test control signal to the gate terminal of each of the plurality of switches;

a first control line for supplying a first test data signal to first terminals of the plurality of switches connected to data lines which supply data signals to pixels disposed in an odd numbered pixel columns; and a second control line for supplying a second test data signal to first terminals of the plurality of switches connected to data lines which supply data signals to pixels disposed in an even numbered pixel columns.

5. The display device of claim 4, wherein the first test data signal is a black data voltage and the second test data signal is a white data voltage.

6. The display device of claim 4, wherein the second terminals of the plurality of switches are connected to the plurality of data lines via the plurality of fan-out lines.

7. The display device of claim 6, wherein the plurality of switches are implemented as transistors, the gate terminal is a gate electrode, the first terminal is a drain electrode, and the second terminal is a source electrode.

8. The display device of claim 6, wherein fan-out lines disposed adjacent to each other in the second direction are disposed on different layers.

9. The display device of claim 4, further comprising:

a lighting circuit disposed in the non-display area and disposed between the display area and the test unit, wherein the lighting circuit is located adjacent to the display area.

10. The display device of claim 9, wherein the plurality of data lines are connected to the plurality of fan-out lines through the lighting circuit.

11. The display device of claim 1, wherein each of the plurality of connection wires further comprises a second portion extending in the first direction.

12. The display device of claim 11, wherein the second portion is disposed on a same layer as the plurality of data lines.

13. A display device comprising:

a plurality of pixels arranged in a matrix configuration along a plurality of pixel columns and a plurality of pixel rows, each of the plurality of pixels including a plurality of sub-pixels disposed in a display area;

a plurality of wire pads disposed in a non-display area that is a peripheral area of the display area and disposed on one side of the display area;

a plurality of fan-out lines connecting the plurality of sub-pixels to the plurality of wire pads;

a plurality of connection wires, wherein each of the plurality of connection wires connects each of the plurality of wire pads to a corresponding data line extending in a first direction, and a first connection wire of at least one of the plurality of connection wires comprises a first portion disposed in the display area and extending in a second direction crossing the first direction; and a test unit disposed between the plurality of wire pads and the display area and electrically connected to the plurality of fan-out lines, wherein the test unit comprises:

a plurality of switches, each of the plurality of switches including a gate terminal, a first terminal and a second terminal;

a test voltage line for supplying a test control signal to the gate terminal of each of the plurality of switches;

a first control line for supplying a first test data signal to a first terminal of one of the plurality of switches connected to a data line which supplies a data signal to a sub-pixel disposed in an odd numbered pixel column; and a second control line for supplying a second test data signal to a first terminal of one of the plurality switches connected to a data line which supplies a data signal to a sub-pixel disposed in an even numbered pixel column, and wherein the first portion of the first connection wire, which extends in the second direction, directly and physically contacts a first data line of the plurality of data lines, which extends in the first direction, in the display area.

14. The display device of claim 13, wherein the second terminals of the plurality of switches are connected to a plurality of data lines, respectively.

15. The display device of claim 14, wherein the second terminals of the plurality of switches are connected to the plurality of data lines via the plurality of fan-out lines, respectively.

16. The display device of claim 15, wherein the plurality of switches are implemented as transistors, and the gate terminal is a gate electrode, the first terminal is a drain electrode, and the second terminal is a source electrode.

17. The display device of claim 15, wherein fan-out lines disposed adjacent to each other are disposed on different layers.

18. The display device of claim 13, wherein the first test data signal is a black data voltage and the second test data signal is a white data voltage.

19. An electronic apparatus comprising a display device, wherein the display device comprises:

a display driver circuit receiving image data;

a plurality of pixels arranged in a matrix configuration along a plurality of pixel columns and a plurality of pixel rows and receiving the image data, each of the plurality of pixels including a plurality of sub-pixels disposed in a display area;

a plurality of data lines extending in a first direction to traverse the display area and connected to the plurality of sub-pixels, respectively;

a plurality of wire pads disposed in a non-display area that is a peripheral area of the display area and disposed on one side of the display area;

a plurality of fan-out lines extending in the first direction and connected to the plurality of wire pads, respectively;

a plurality of connection wires, wherein each of the plurality of connection wires connects each of the plurality of wire pads to each of the plurality of data lines, respectively, and a first connection wire of at least one of the plurality of connection wires comprises a first portion disposed in the display area and extending in a second direction crossing the first direction; and a test unit disposed between the plurality of wire pads and the display area, and electrically connected to the plurality of fan-out lines, wherein the test unit is configured to apply a test voltage to the plurality of fan-out lines to check a short-circuit or an open-circuit in the plurality of fan-out lines, wherein the first portion of the first connection wire, which extends in the second direction, directly and physically contacts a first data line of the plurality of data lines, which extends in the first direction, in the display area.

* * * * *